United States Patent
Adachi et al.

(10) Patent No.: US 9,874,808 B2
(45) Date of Patent: Jan. 23, 2018

(54) MASK BLANK, MASK BLANK WITH NEGATIVE RESIST FILM, PHASE SHIFT MASK, AND METHOD FOR PRODUCING PATTERN FORMED BODY USING SAME

(71) Applicant: DAI NIPPON PRINTING CO., LTD., Tokyo-to (JP)

(72) Inventors: Takashi Adachi, Tokyo (JP); Youichi Miura, Tokyo (JP); Hideyoshi Takamizawa, Tokyo (JP); Katsuya Hayano, Tokyo (JP); Youhei Ohkawa, Tokyo (JP); Hiroshi Watanabe, Agrate Brianza (IT); Ayako Tani, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 127 days.

(21) Appl. No.: 14/912,831

(22) PCT Filed: Aug. 21, 2014

(86) PCT No.: PCT/JP2014/071886
§ 371 (c)(1),
(2) Date: Feb. 18, 2016

(87) PCT Pub. No.: WO2015/025922
PCT Pub. Date: Feb. 26, 2015

(65) Prior Publication Data
US 2016/0195803 A1   Jul. 7, 2016

(30) Foreign Application Priority Data

Aug. 21, 2013 (JP) .................................. 2013-171766
Mar. 28, 2014 (JP) .................................. 2014-070305

(51) Int. Cl.
G03F 1/32 (2012.01)
G03F 1/50 (2012.01)
G03F 7/32 (2006.01)

(52) U.S. Cl.
CPC . *G03F 1/32* (2013.01); *G03F 7/32* (2013.01)

(58) Field of Classification Search
None
See application file for complete search history.

(56) References Cited

U.S. PATENT DOCUMENTS 8,329,364 B2    12/2012 Iwashita et al.
2002/0068228 A1  6/2002 Kureishi et al.
(Continued)

FOREIGN PATENT DOCUMENTS

JP   7-199447   8/1995
JP   8-015851   1/1996
(Continued)

*Primary Examiner* — Stephen Rosasco
(74) *Attorney, Agent, or Firm* — Hamre, Schumann, Mueller & Larson, P.C.

(57) ABSTRACT

The present invention provides a mask blank used to produce a halftone phase shift mask to which ArF excimer laser exposure light is to be applied. The present invention attains the object by providing the mask blank comprising a transparent substrate, and a light semitransmissive layer formed on the transparent substrate and made only of Si and N or a light semitransmissive layer formed on the transparent substrate and made only of Si, N and O, wherein the light semitransmissive layer has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light, and further has a layer thickness of 57 to 67 nm.

20 Claims, 12 Drawing Sheets
(6 of 12 Drawing Sheet(s) Filed in Color)

(56) References Cited

U.S. PATENT DOCUMENTS

| | | |
|---|---|---|
| 2002/0122991 A1 | 9/2002 | Shiota et al. |
| 2003/0180631 A1 | 9/2003 | Shiota et al. |
| 2004/0086788 A1 | 5/2004 | Shiota et al. |
| 2005/0244722 A1 | 11/2005 | Okada et al. |
| 2007/0212619 A1 | 9/2007 | Yoshikawa et al. |
| 2008/0261124 A1 | 10/2008 | Saito |
| 2009/0311612 A1 | 12/2009 | Kitahata et al. |
| 2010/0092874 A1 | 4/2010 | Nozawa et al. |
| 2010/0227444 A1 | 9/2010 | Imai et al. |

FOREIGN PATENT DOCUMENTS

| | | |
|---|---|---|
| JP | 2002-169265 | 6/2002 |
| JP | 2002-258458 | 9/2002 |
| JP | 2002-323746 | 11/2002 |
| JP | 2002-351049 | 12/2002 |
| JP | 2003-322948 | 11/2003 |
| JP | 2003-322955 | 11/2003 |
| JP | 2004-525423 | 8/2004 |
| JP | 2005-284213 | 10/2005 |
| JP | 2007-017998 | 1/2007 |
| JP | 2007-193368 | 8/2007 |
| JP | 2007-241060 | 9/2007 |
| JP | 2007-241137 | 9/2007 |
| JP | 2008-026627 | 2/2008 |
| JP | 2008-256781 | 10/2008 |
| JP | 2008-310091 | 12/2008 |
| JP | 2009-217282 | 9/2009 |
| JP | 2010-009038 | 1/2010 |
| JP | 2010-210679 | 9/2010 |
| JP | 2010-237692 | 10/2010 |
| WO | 02/086621 | 10/2002 |
| WO | 2009/157506 | 12/2009 |

MASK BLANK, MASK BLANK WITH NEGATIVE RESIST FILM, PHASE SHIFT MASK, AND METHOD FOR PRODUCING PATTERN FORMED BODY USING SAME

TECHNICAL FIELD

The present invention relates to a mask blank and a phase shift mask which are each used to produce, for example, a semiconductor element; and a method for producing a pattern formed body, using the mask. The invention relates more specifically to a mask blank, a negative-type resist layer attached mask blank, and a phase shift mask which each make it possible that when a pattern of the mask is transferred onto a wafer, using a high-NA exposure apparatus using ArF excimer laser exposure light having a wavelength of 193 nm in photolithography, the pattern is made high in transferring property, and excellent in resistance against irradiation with ArF excimer laser exposure light and cleaning resistance; and to a method for producing a pattern formed body using the same.

BACKGROUND ART

As a means for improving the resolution of a phase shift mask used in photolithography, a halftone phase shift mask is known, which is composed of regions which transmit light and regions which semi-transmit light. As a typical example of the halftone phase shift mask, known is a halftone phase shift mask having a transmittance of 6% in which a MoSi layer is used as a light semitransmissive layer.

When the pitch of interconnects to be formed in a wafer is made fine, a light semitransmissive layer which constitutes regions which should semi-transmit light in a halftone phase shift mask is required to be a layer having properties of being smaller in EMF bias and OPC bias and larger in exposure latitude and depth of focus (EL-DOF) as properties desired when the interconnects are transferred onto the wafer.

In the case of a halftone phase shift mask, interference of light at its pattern-element boundary regions that is based on phase effect makes the intensity of the light at the interference-caused regions into a value of zero, so that images to be transferred can be improved in contrast. It can be expected that if the transmittance of the mask is as high as 15% or more, this phase effect becomes more remarkable so that the images to be transferred can be further improved in contrast.

In order to adjust the transmittance of a light semitransmissive layer in a halftone phase shift mask into a target range, a metal is incorporated into the light semitransmissive layer to adjust the light transmittance of the layer (Patent Literatures 1, 2, 3 and 4).

However, in the conventional halftone phase shift masks, which each have a metal-incorporated light semitransmissive layer, it is known that about the resistance of their pattern against irradiation with ArF excimer laser exposure light, and the cleaning resistance, problems are caused by the incorporation of the metal into the light semitransmissive layer. As described in Examples in Patent Literatures 1 and 2 also, Mo is frequently used as the metal to be incorporated into the light semitransmissive layer. When Mo is used, Mo is irradiated with ArF excimer laser exposure light for a long period so that water is generated from the humid atmosphere. The MoSi layer is oxidized by the generated water so that an oxide layer of silicon (Si) grows. It is known that the growth causes a problem about resistance against irradiation with the laser, this problem being a problem of causing a phenomenon that the masks are changed in pattern critical dimension. In this case, it is known that a problem about cleaning resistance is also caused, this problem being a problem that such a phenomenon is caused in the same manner in the step of cleaning the halftone phase shift masks.

In the meantime, in the case of attempting to use a metal-free light semitransmissive layer to make a halftone phase shift mask to avoid such problems about resistance against irradiation with ArF excimer laser exposure light, and cleaning resistance, regions of the mask where the light semitransmissive layer is formed become too large in transmittance (Patent Literatures 5 and 6).

As a result, for example, in Patent Literature 5, it is necessary to laminate a metal-free phase-adjusting layer (light semitransmissive layer), and a transmittance-adjusting layer which is different from the phase-adjusting layer and contains a metal onto each other, thereby forming a halftone phase shift mask since only the metal-free phase-adjusting layer (light semitransmissive layer) makes the mask too large in transmittance.

In the case of using a halftone phase shift mask usable to produce a semiconductor element to transfer a fine pattern for contact holes, lines, and others to a wafer, the following method is also known to enlarge the mask in depth of focus at the time of exposure for the transfer: a method of forming a main pattern, which is a region that is actually resolved to correspond to the fine pattern, and an assistant pattern that is not actually resolved to a wafer, using a light semitransmissive layer of the halftone phase shift mask. According to this method, a fluctuation in the critical dimension (CD) of the pattern can be decreased when the pattern is defocused since assisting diffraction light by the assistant pattern can improve exposure latitude for main pattern region.

In advanced techniques of a wafer process of transferring, onto a wafer, a mask pattern of a halftone phase shift mask used to produce a semiconductor element, in the case of transferring a fine pattern as described above for contact holes, lines or others onto the wafer, it is required in the halftone phase shift mask to form a light semitransmissive layer pattern in which the width or length of one or each pattern-element of a main pattern as described above is set, in particular, into the range of 100 to 300 nm. Furthermore, as in this case the width or length of one or each pattern-element of an assistant pattern as described above is larger, a fluctuation in the critical dimension (CD) of the pattern can be more largely decreased when the pattern is defocused. However, if the width or length is too large, an undesired pattern is resolved onto the wafer. Thus, when the width or length of the pattern-element of the main pattern is adjusted into, for example, the range of 100 to 300 nm as described above, the width or length of the pattern-element of the assistant pattern is preferably set to 60 nm or less.

Furthermore, in a wafer process of using positive tone development to transfer, onto a wafer, a mask pattern of a halftone phase shift mask used to produce a semiconductor element, in the case of forming a pattern for openings, such as contact holes or spaces, onto a resist on the wafer, a main pattern and an assistant pattern as described above are each made as a concave-element pattern in which a light semitransmissive layer in the halftone phase shift mask is partially hollowed out. By contrast, in a wafer process of using negative tone development to transfer, onto a wafer, a mask pattern of a halftone phase shift mask used to produce a semiconductor element, in the case of forming a pattern for openings, such as contact holes or spaces, onto a resist on the wafer, it is necessary that a main pattern and an assistant pattern as described above are each made as a convex-element pattern made of a light semitransmissive layer in the halftone phase shift mask. Consequently, the assistant pattern becomes a convex-element pattern made of one or more pattern-elements (each) made of the light semitransmissive layer and having a width or length of 60 nm or less.

In the use of a halftone phase shift mask used to produce an advanced semiconductor element, it is a very important theme to remove foreign matters by cleaning. In a field in which this technique is used, particularly, the following method is used as a foreign-matter-physically-removing method: a method in which when the halftone phase shift mask is cleaned, ultrasonic waves are applied to a cleaning chemical solution to use impacts based on the breaking of bubbles.

However, when the power of the ultrasonic waves is heightened to gain a strong removing power, there remains a problem that the waves give damage to a fine convex-element pattern as described, which is made of alight semitransmissive layer. It is presumed that the damage of the convex-element pattern is mainly caused by a matter that pulling-down force is applied to the convex-element pattern by impacts generated when the bubbles generated by the ultrasonic waves are broken. Accordingly, when the layer thickness of the light semitransmissive layer is large, the convex-element pattern becomes large in surface area. Thus, when bubbles are generated in the cleaning solution at the same density, a region of the convex-element pattern where the bubbles are generated becomes wide. This matter causes a problem that the damage of the convex-element pattern further increases so that the convex-element pattern is chipped. Moreover, when the layer thickness of the light semitransmissive layer is large, the convex-element pattern also suffers impacts based on bubbles generated at a higher position. In this way, the moment of the impacts becomes larger to cause a problem that the convex-element pattern is largely damaged to be chipped. It is therefore conceivable that a decrease in the layer thickness of the light semitransmissive layer is a very effective means for restraining the convex-element pattern from being damaged by ultrasonic wave cleaning.

In a method for calculating an optical proximity correction (OPC processing) for a mask pattern, approximate calculation has been mainly used. When the precision thereof needs to be made higher, an FDTD (finite-difference time-domain) method has been occasionally used, in which an exact solution is calculated. The FDTD method for calculating an exact solution is a method of developing Maxwell's equation directly to a difference equation for spatial/time regions to make a sequential computation, thereby making electric-field/magnetic-field determinations, and is a method of making a calculation, considering the layer thickness of a light semitransmissive layer pattern. In the FDTD method for calculating an exact solution, a spatial region is divided into finite elements to make a calculation on each of individual lattice points thereof. Thus, the calculation period depends on the region to be calculated. Thus, when this method is used to make a calculation for the whole of a mask, the calculation period becomes enormously long. Accordingly, for a calculation for the whole of a mask, without using any FDTD method for calculating an exact solution, an approximate calculation is used.

The approximate calculation is a simplified method which makes no consideration about the layer thickness of a light semitransmissive layer pattern as compared with the FDTD method for calculating an exact solution, and is not a method for making an exact calculation. Thus, in the case of calculating an optical proximity correction (OPC processing) for a phase shift mask used to form a fine pattern onto a wafer through an approximate calculation, this case being different from the case of making an exact solution through the FDTD method, a shielding effect caused by the layer thickness of the light semitransmissive layer pattern cannot be incorporated into calculation results. Hitherto, the thickness of a light semitransmissive layer pattern has been large so that the shielding effect has been increased, which has been caused by the layer thickness of the light semitransmissive layer pattern. As a result, conventionally, in the case of calculating an optical proximity correction (OPC processing) for a phase shift mask used to form a fine pattern onto a wafer through an approximate calculation, the shielding effect caused by the layer thickness of its light semitransmissive layer pattern is largely affected to generate a difference between results from any exact-solution calculation and ones from the approximate calculation. This matter may cause a problem that the fine pattern produced on the wafer is brought into some other member or separated by effect of the pattern to which the approximate solution calculation is used to apply an optical proximity correction (OPC processing) against design intention.

From such a matter, in making a design of a light semitransmissive layer pattern in a phase shift mask used to form a fine pattern onto a wafer, it is necessary when a calculation is made for an optical proximity correction (OPC processing) through an approximate calculation that a more intense restriction is imposed onto the design of the light semitransmissive layer pattern not to result, against design intention, in the contact or separation of the fine pattern on the wafer. Consequently, the flexibility of the design of the light semitransmissive layer pattern is low.

CITATION LIST

Patent Literatures

Patent Literature 1: Japanese Patent Application Publication (JP-A) No. 2003-322948
Patent Literature 2: JP-A No. 2009-217282
Patent Literature 3: JP-A No. 2005-284213
Patent Literature 4: JP-A No. 2010-009038
Patent Literature 5: JP-A No. 2002-351049
Patent Literature 6: JP-A No. 2008-310091

SUMMARY OF INVENTION

Technical Problem

In light of the above-mentioned actual situation, the present invention has been made. A main object thereof is to make a pattern of a phase shift mask excellent in transferring property and high in resistance against irradiation with ArF excimer laser exposure light and cleaning resistance in photolithography; avoid any ultrasonic-cleaning-based chipping of a light semitransmissive layer pattern in the phase shift mask; and heighten the design flexibility of the light semitransmissive layer pattern in the phase shift mask.

Solution to Problem

To solve the above problem, the present invention provides a mask blank used to produce a halftone phase shift mask to which ArF excimer laser exposure light is to be applied, the mask blank comprises a transparent substrate, and a light semitransmissive layer formed on the transparent substrate and made only of Si and N or a light semitransmissive layer formed on the transparent substrate and made only of Si, N and O, characterized in that the light semitransmissive layer has an extinction coefficient of 0.2 to 0.45 at a wavelength of ArF excimer laser exposure light, a refractive index of 2.3 to 2.7 at the wavelength of ArF excimer laser exposure light, and a transmittance of 15% to 38% at the wavelength of ArF excimer laser exposure light, and further has a layer thickness of 57 nm to 67 nm.

According to the present invention, a phase shift mask made from this mask blank is used to set, at its pattern-element boundaries, the intensity of the light to zero by light interference based on phase effect, thereby improving the resultant transferred image in contrast. Thus, when a pattern formed body is produced with this improvement, the phase effect can be made more remarkable by the high transmittance which the light semitransmissive layer has. Moreover, the light semitransmissive layer contains no metal; thus, no oxide layer of silicon (Si) grows even when this layer is irradiated with ArF excimer laser exposure light for a long period. Consequently, the critical dimension of the pattern can be prevented from being changed. Also in the step of cleaning the phase shift mask, the critical dimension of the pattern can be similarly prevented from being changed. Accordingly, in photolithography, the pattern of the pattern of the phase shift mask can be made excellent in transferring property and high in resistance against irradiation with ArF excimer laser exposure light and cleaning resistance.

In this invention, it is preferred that the light semitransmissive layer is formed directly onto the transparent substrate. The mask blank does not have an etching barrier layer between the transparent substrate and the light semitransmissive layer; thus, it becomes unnecessary to perform an etching step plural times. Consequently, the etching process does not become complicated, and further the following can be prevented: a degradation of the shape of the light semitransmissive layer or the transparent substrate, and a deterioration in the evenness of the shape of the light semitransmissive layer, these inconveniences being based on difficulty in the etching of the etching barrier layer.

Further, in the invention, the mask blank preferably further comprises a light-shielding layer formed on the light semitransmissive layer, the optical density (OD value) of this light-shielding layer at the wavelength of ArF excimer laser exposure light being adjusted to be in total to a desired optical density (OD value) when combined with an optical density (OD value) of the light semitransmissive layer. This case, where the mask blank further has the light-shielding layer, makes it possible that when the resultant mask has a light semitransmissive layer pattern-element large in area, the mask more remarkably gains an advantageous effect of avoiding a problem that the resultant transferred image is made obscure by exposure light transmitted through this pattern-element.

Further, in the invention, the light-shielding layer preferably has a monolayered structure comprising a light-absorbing layer formed on the light semitransmissive layer and having an etching barrier function for the light semitransmissive layer and a light-absorbing function of absorbing ArF excimer laser exposure light. This case makes it possible to yield a mask having necessary functions through steps the number of which is smaller.

Further, in the invention, the light-shielding layer preferably has a bilayered structure comprising: a light-absorbing layer formed on the light semitransmissive layer and having an etching barrier function for the light semitransmissive layer and a light-absorbing function of absorbing ArF excimer laser exposure light; and a hard mask layer formed on the light-absorbing layer and having an etching barrier function for the light-absorbing layer. This case makes it possible to use a pattern formed by etching the hard mask layer instead of a resist pattern to be used when the light-absorbing layer is etched. As a result, a fine pattern of the light-shielding layer is easily formed.

Further, in the invention, the light-shielding layer preferably has a trilayered structure comprising: an etching barrier layer formed on the light semitransmissive layer and having an etching barrier function for the light semitransmissive layer; a light-absorbing layer formed on the etching barrier layer and having a light-absorbing function of absorbing ArF excimer laser exposure light; and a hard mask layer formed on the light-absorbing layer and having an etching barrier function for the light-absorbing layer. This case makes it possible to use a pattern formed by etching the hard mask layer instead of a resist pattern to be used when the light-absorbing layer is etched. As a result, the fine pattern of the light-shielding layer is easily formed. About the raw material of the layer having a light-absorbing function of absorbing ArF excimer laser exposure light, the selection flexibility thereof is heightened so that the layer thickness of the light-shielding layer can be made smaller. Moreover, the light-absorbing layer and the etching barrier layer can be etched, respectively, with reactive etching gases different from each other. Thus, the etching barrier layer can be rendered a layer having an etching barrier function, for the light semitransmissive layer, that favorably prevents the light semitransmissive layer from being damaged when the light-absorbing layer is etched.

Further, in the invention, the light-absorbing layer preferably includes simple silicon (Si). This case makes it possible to prevent the light-absorbing layer from being damaged when the hard mask layer is etched.

Further, in the invention, the light-shielding layer preferably has the optical density (OD value) of the light-shielding layer at the wavelength of ArF excimer laser exposure light adjusted to be in total into a value of 3.0 or more when combined with optical density (OD value) of the light semitransmissive layer. This case makes it possible that a necessary light-shielding property is given to a desired region of the mask when the mask is exposed to light.

The present invention also provides a negative-type resist layer attached mask blank comprising the above-mentioned mask blank, and a negative-type resist layer formed on the mask blank.

This invention makes it possible to produce a negative-type phase shift mask which will be later detailed in a shorter time.

Further, the present invention provides a halftone phase shift mask to which ArF excimer laser exposure light is to be applied, the mask comprising a transparent substrate, and a light semitransmissive layer pattern formed on the transparent substrate and made only of Si and N or a light semitransmissive layer pattern formed on the transparent substrate and made only of Si, N and O, the light semitransmissive layer pattern has an extinction coefficient of 0.2 to 0.45 at a wavelength of ArF excimer laser exposure light, a refractive index of 2.3 to 2.7 at the wavelength of ArF excimer laser exposure light, and a transmittance of 15% to 38% at the wavelength of ArF excimer laser exposure light, and further has a layer thickness of 57 nm to 67 nm.

According to the present invention, the phase shift mask is used to set, at its pattern-element boundaries, the intensity of the light to zero by light interference based on phase effect, thereby improving the resultant transferred image in contrast. Thus, when a pattern formed body is produced with this improvement, the phase effect can be made more remarkable by the high transmittance which the light semitransmissive layer pattern has. Moreover, the light semitransmissive layer pattern contains no metal; thus, no oxide layer of silicon (Si) grows even when this pattern is irradiated with ArF excimer laser exposure light for a long period. Consequently, the critical dimension of the pattern can be prevented from being changed. Also in the step of cleaning the phase shift mask, the critical dimension of the pattern can be similarly prevented from being changed. Accordingly, this invention makes it possible in photolithography to make the pattern of the phase shift mask high in transferring property and high in resistance against irradiation with ArF excimer laser exposure light and cleaning resistance.

In this invention, when the light semitransmissive layer pattern has a convex pattern-element having a width or length of 60 nm or less, the present phase shift mask can remarkably exhibit an advantageous effect of avoiding pattern chipping caused by cleaning the pattern using ultrasonic waves having an intense removing power in a cleaning solution.

In this invention, when the light semitransmissive layer pattern has a main pattern which is to be resolved onto a wafer, and an assistant pattern which is used to assist the resolution of the main pattern and is not to be resolved onto the wafer and further the assistant pattern is a convex-element pattern having one or more pattern-elements (each) having a width or length of 60 nm or less, the phase shift mask can remarkably exhibit an advantageous effect of avoiding pattern chipping, which is caused by cleaning the pattern using ultrasonic waves having an intense removing power in a cleaning solution.

Further, in the invention, the light semitransmissive layer pattern is preferably formed directly on the transparent substrate. The phase shift mask does not have an etching barrier layer between the transparent substrate and the light semitransmissive layer; and thus, it becomes unnecessary to perform an etching step plural times. Consequently, the etching process does not become complicated, and further it is possible to prevent a degradation of the shape of the light semitransmissive layer or the transparent substrate, and a deterioration in the evenness of the shape of the light semitransmissive layer, these inconveniences being based on difficulty in the etching of the etching barrier layer.

Further, in the invention, the phase shift mask is preferably a negative-type phase shift mask. About the light semitransmissive layer, the transmittance thereof ranges from 15% to 38% at the wavelength of ArF excimer laser exposure light to be higher than that of conventional phase shift masks. Thus, in negative tone development, at edges of light-shielding layer regions corresponding to a fine pattern, such as one for contact holes, phase effect becomes larger. This case makes it possible to transfer the fine pattern, such as that for the contact holes, more easily onto the wafer by negative tone development than conventional cases.

Further, in the invention, the phase shift mask preferably further comprises a light-shielding layer pattern formed on the light semitransmissive layer pattern, the optical density (OD value) of this light-shielding layer pattern at the wavelength of ArF excimer laser exposure light being adjusted to be in total into a desired value (OD value) when combined with an optical density (OD value) of the light semitransmissive layer pattern. This case, where the mask further has the light-shielding layer pattern, makes it possible that when the mask has a light semitransmissive layer pattern-element large in area, the mask more remarkably gains an advantageous effect of avoiding a problem that the resultant transferred image is made obscure by exposure light transmitted through this pattern-element.

Further, in the invention, the light-shielding layer pattern preferably has a monolayered structure comprising a light-absorbing layer pattern formed on the light semitransmissive layer pattern and having an etching barrier function for the light semitransmissive layer pattern and a light-absorbing function of absorbing ArF excimer laser exposure light. This case makes it possible to form the light-shielding layer pattern by using, in the light-shielding layer having the above-mentioned bilayered structure, a pattern formed by etching the hard mask layer instead of a resist pattern to be used when the light-absorbing layer is etched. As a result, a fine pattern of the light-shielding layer pattern is easily formed.

Further, in the invention, the light-shielding layer pattern preferably has a bilayered structure comprising: an etching barrier layer pattern formed on the light semitransmissive layer pattern and having an etching barrier function for the light semitransmissive layer pattern; and a light-absorbing layer pattern formed on the etching barrier layer pattern and having a light-absorbing function of absorbing ArF excimer laser exposure light. This case makes it possible to use, in the light-shielding layer having the above-mentioned trilayered structure, a pattern formed by etching the hard mask layer instead of a resist pattern to be used when the light-absorbing layer is etched. As a result, a fine pattern of the light-shielding layer can easily be formed. About the raw material of the layer having a light-absorbing function of absorbing ArF excimer laser exposure light, the selection flexibility thereof is heightened so that the layer thickness of the light-shielding layer pattern can be made smaller. Moreover, the light-absorbing layer and the etching barrier layer can be etched, respectively, with reactive etching gases different from each other. Thus, the etching barrier layer can be rendered a layer having an etching barrier function, for the light semitransmissive layer, that favorably prevents the light semitransmissive layer from being damaged when the light-absorbing layer is etched.

Further, in the invention, the light-absorbing layer pattern preferably includes simple silicon (Si). This case makes it possible to prevent the light-absorbing layer from being damaged when the hard mask layer is etched.

Further, in the invention, about the light-shielding layer pattern preferably has the optical density (OD value) at the wavelength of ArF excimer laser exposure light adjusted to be in total into a value of 3.0 or more when combined with the optical density (OD value) of the light semitransmissive layer pattern. This case makes it possible to give a necessary light-shielding property to a desired region of the mask when light is exposed to the mask.

The present invention also provides a method for producing a pattern formed body, using a phase shift mask made from the above-mentioned mask blank, comprising a step of using the phase shift mask to form a resist pattern by negative tone development.

According to the present invention, the transmittance of the light semitransmissive layer ranges from 15% to 38% at a wavelength of ArF excimer laser exposure light to be higher than that of conventional light semitransmissive layers. Thus, in negative tone development, at edges of light-shielding layer regions corresponding to a fine pattern, such as one for contact holes, phase effect becomes larger. This case makes it possible to transfer the fine pattern, such as that for the contact holes, more easily onto a wafer by negative tone development than conventional cases.

Advantageous Effects of Invention

The present invention produces advantageous effects of making pattern of a phase shift mask excellent in transferring property and high in resistance against irradiation with ArF excimer laser exposure light and cleaning resistance in photolithography; of avoiding any ultrasonic-cleaning-based chipping of a light semitransmissive layer pattern in the phase shift mask; and of heightening the design flexibility of the light semitransmissive layer pattern in the phase shift mask.

BRIEF DESCRIPTION OF DRAWINGS

The patent or application file contains at least one drawing executed in color. Copies of this patent or patent application publication with color drawings will be provided by the Office upon request and payment of the necessary fee.

FIG. 17-1 is a graph representing, as simulation results, a relationship between the depth of focus and the exposure latitude of a phase shift mask of each of Example 1 and Comparative Example 1 when a 180-nm-hole-pitch pattern of the mask is transferred.

FIG. 17-2 is a graph representing, as simulation results, a relationship between the depth of focus and the exposure latitude of the phase shift mask of each of Example 1 and Comparative Example 1 when a 240-nm-hole-pitch pattern of the mask is transferred.

FIG. 17-3 is a graph representing, as simulation results, a relationship between the depth of focus and the exposure latitude of the phase shift mask of each of Example 1 and Comparative Example 1 when a 300-nm-hole-pitch pattern of the mask is transferred.

DESCRIPTION OF EMBODIMENTS

A description will be made in detail about the mask blank, the negative-type resist layer attached mask blank, and the phase shift mask of the present invention; and a method for producing a pattern formed body using the same.

A. Mask Blank

The mask blank of the present invention is a mask blank used to produce a halftone phase shift mask to which ArF excimer laser exposure light is to be applied, and this mask comprises a transparent substrate, and a light semitransmissive layer formed on the transparent substrate and made only of Si (silicon) and N (nitrogen) or a light semitransmissive layer formed on the transparent substrate and made only of Si (silicon), N (nitrogen) and O (oxygen), and is characterized in that the light semitransmissive layer has an extinction coefficient of 0.2 to 0.45 at a wavelength of ArF excimer laser exposure light, a refractive index of 2.3 to 2.7 at the wavelength of ArF excimer laser exposure light, and a transmittance of 15% to 38% at the wavelength of ArF excimer laser exposure light, and further has a layer thickness of 57 nm to 67 nm.

Figure 1:
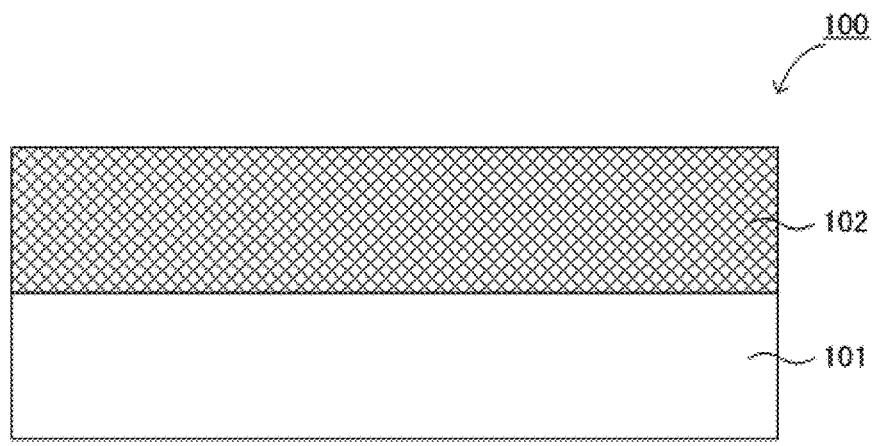
FIG. 1 is a schematic sectional view illustrating an example of the mask blank of the present invention.

FIG. 1 is a schematic sectional view illustrating an example of the mask blank of the present invention. A mask blank 100 illustrated in FIG. 1 is a mask blank used to produce a halftone phase shift mask to which ArF excimer laser exposure light is to be applied. The mask blank 100 illustrated in FIG. 1 comprises a transparent substrate 101, and a light semitransmissive layer 102 formed on the transparent substrate 101 and having a monolayered structure made only of Si and N, or Si, N and O. The light semitransmissive layer 102 has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light. The light semitransmissive layer 102 also has a layer thickness of 57 to 67 nm.

In the mask blank of the present invention, the light semitransmissive layer has a high transmittance ranging from 15 to 38% as the transmittance thereof at the wavelength of ArF excimer laser exposure light. Accordingly, a phase shift mask made from the mask blank of the invention is used to set, at its pattern-element boundaries, the intensity of the light to zero by light interference based on phase effect, thereby improving the resultant transferred image in contrast. Thus, when a pattern formed body is produced with the improvement, the phase effect can be made more remarkable by the high transmittance which the light semitransmissive layer has. Moreover, the light semitransmissive layer contains no metal; thus, no oxide layer of silicon (Si) grows even when this layer is irradiated with ArF excimer laser exposure light for a long period. Consequently, the critical dimension of the pattern can be prevented from being changed. Also in the step of cleaning the phase shift mask, the critical dimension of the pattern can be similarly prevented from being changed. Accordingly, the present invention makes it possible in photolithography to make the pattern of the phase shift mask excellent in transferring property and high in resistance against irradiation with ArF excimer laser exposure light and cleaning resistance.

About the mask blank of the present invention, the layer thickness of the light semitransmissive layer ranges from 57 to 67 nm to be smaller than that of conventional light semitransmissive layers. Thus, in a halftone phase shift mask produced from the mask blank of the invention, the height of a convex-element pattern made of one or more pattern-elements (each) made of the light semitransmissive layer and having a width or length of, for example, 60 nm or less is lower than that in conventional halftone phase shift masks. This matter results in, for example, the following in the step of cleaning the phase shift mask produced from the mask blank of the invention: a decrease in the area of a region of the convex-element pattern which receives impacts by the breaking of bubbles when the convex-element pattern is cleaned by ultrasonic waves; and a lowering in the level of a position of the convex-element pattern which receives the impacts by the breaking of the bubbles. As a result, for example, chipping of the convex-element pattern can be avoided, the chipping being caused by cleaning the convex-element pattern, using ultrasonic waves having a strong removing power, out of the ultrasonic waves, in a cleaning solution.

Such a wording that chipping of the pattern that is caused by ultrasonic wave cleaning denotes that the pattern, which is in a convex-element form, is collapsed or lost by pulling-down force generated by impacts caused when bubbles generated by the ultrasonic waves are broken.

About the mask blank of the present invention, the layer thickness of the light semitransmissive layer ranges from 57 to 67 nm to be smaller than that of conventional light semitransmissive layers. Thus, in the case of using a phase shift mask produced from the mask blank of the invention as a phase shift mask used to form a fine pattern onto a wafer, the following can be avoided when a calculation for an optical proximity correction (OPC processing) for the phase shift mask is made through approximate calculation: the accidental error quantity of a correction to be given to data when the mask is designed is made large as in the prior art by effect of a shielding effect caused by the layer thickness of a pattern of the light semitransmissive layer. The avoidance makes it possible to restrain the occurrence of a problem that the fine pattern on the wafer is brought into contact with some other member or separated against design intention.

From such a matter, in the case of using a phase shift mask produced from the mask blank of the present invention to form a fine pattern onto a wafer, the fine pattern on the wafer can be restrained from being brought into contact with some other member or separated against design intention, even when a calculation for an optical proximity correction (OPC processing) is made through approximate calculation in the design of the light semitransmissive layer pattern of the mask. This matter makes it possible to reduce a necessity of imposing a more intense restriction onto the design of the light semitransmissive layer pattern even when the optical proximity correction (OPC processing) calculation is made through approximate calculation. Thus, the flexibility of the design of the light semitransmissive layer pattern can be heightened.

About the mask blank of the present invention, the layer thickness of the light semitransmissive layer ranges from 57 to 67 nm to be smaller than that of conventional light semitransmissive layers; therefore, in the mask blank of the invention, it further becomes easier to form its light semitransmissive layer pattern by etching than in conventional mask blanks. A period necessary for the etching is also sufficient to be short; thus, even when the mask blank does not have an etching barrier layer, for preventing the transparent substrate from being damaged as will be later described, between the transparent substrate and the light semitransmissive layer, the transparent substrate can sufficiently avoid being damaged when the light semitransmissive layer pattern is formed by the etching.

Hereinafter, about the mask blank of the present invention, members of the mask blank and the structure of the mask blank will be separately described.

1. Members of Mask Blank

The members of the mask blank of the present invention will be firstly described. The mask blank of the invention comprises at least a transparent substrate and a light semitransmissive layer.

(1) Light Semitransmissive Layer

The light semitransmissive layer in the present invention is a light semitransmissive layer formed on a transparent substrate which will be later detailed and made only of Si and N, or a light semitransmissive layer formed on a transparent substrate which will be later detailed, and made only of Si, N and O. The light semitransmissive layer has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light, and further has a layer thickness of 57 to 67 nm.

a. Transmittance and Layer Thickness

The transmittance of the light semitransmissive layer at the wavelength of ArF excimer laser exposure light is selected from the range of 15 to 38% as a transmittance higher than that of conventional light semitransmissive layers at the wavelength of ArF excimer laser exposure light. The layer thickness of the light semitransmissive layer is a layer thickness selected from the range of 57 to 67 nm as a layer thickness that is smaller than that of conventional light semitransmissive layers and makes the light semitransmissive layer endurable against being practically used.

The reason why the transmittance in the above-mentioned range is selected for the transmittance of the light semitransmissive layer at the wavelength of ArF excimer laser exposure light is as follows: If the transmittance does not reach the range in an advanced technique of a wafer process of transferring a mask pattern of a halftone phase shift mask having a light semitransmissive layer onto a wafer, the phase shift mask cannot gain a desired phase shift effect. Specifically, the phase shift mask is insufficient in transmittance of antiphase light so that the mask cannot gain a desired light-shielding property. If the transmittance exceeds the range, the light-shielding property of the light semitransmissive layer is made lower than required. Specifically, the transmittance of antiphase light rises so that pattern-elements are unfavorably formed by transmitted light even at a region of the wafer where the formation of no pattern-elements is desired. In conclusion, unless the transmittance in the range is selected, a problem is caused about the transferring property of a desired pattern, as described herein.

The light semitransmissive layer is not particularly limited. The layer is preferably a light semitransmissive layer having a transmittance of 18 to 38%, in particular, preferably one having a transmittance of 20 to 38%. If the transmittance does not reach this range, the resultant phase shift mask cannot remarkably gain a desired phase shift effect. If the transmittance exceeds the range, the light-shielding property of the light semitransmissive layer is made lower than required so that a problem is caused about the transferring property of a desired pattern.

The reason why the layer thickness is selected from the above-mentioned range is as follows: If the height of the convex-element pattern made of one or more pattern-elements (each) made of the light semitransmissive layer and having a width or length of 60 nm or less exceeds the range, in the step of cleaning a phase shift mask produced from the mask blank, this convex-element pattern is cleaned by use of ultrasonic waves having a strong removing power in a cleaning solution, and thus, the convex-element pattern is chipped to cause pattern chipping. If the layer thickness of the light semitransmissive layer exceeds the range, it becomes difficult to form the light semitransmissive layer pattern by etching in the same manner as in the prior art. A period required for the etching does not become short. Thus, unless the mask blank has an etching barrier layer between the transparent substrate and the light semitransmissive layer, the transparent substrate is damaged when the light semitransmissive layer pattern is formed by the etching. Furthermore, if the layer thickness does not reach the range, it becomes difficult in the light semitransmissive layer having an extinction coefficient (k) in the above-mentioned range that an antiphase which will be later detailed is gained.

Furthermore, the selection of the layer thickness in the above-mentioned range makes it possible to produce the following advantageous effects. The light semitransmissive layer made only of Si and N, or the light semitransmissive layer made only of Si, N and O is a layer in which a residue defect portion, which is an unnecessary surplus portion, is not easily amended by an etching removing method based on the radiation of a focused ion beam (FIB) using, for example, Ga ions, which are used to amend an existing ordinary photomask, or an etching removing method based on the radiation of an electron beam (EB). However, in the mask blank of the present invention, the layer thickness of the light semitransmissive layer ranges from 57 to 67 nm to be smaller than that of conventional light semitransmissive layers. Thus, although the light semitransmissive layer is a layer made only of Si and N, or made only of Si, N and O, this layer can more easily attain the amendment of its residue defect portion than conventional light semitransmissive layers each made only of the same material. Moreover, when the layer thickness of the light semitransmissive layer is small, side etching is restrained which is generated at the time of the etching removal. Thus, the precision of the amended position is improved so that sectional shapes of the light semitransmissive layer are further improved. Consequently, the halftone phase shift mask having the amended light semitransmissive layer becomes better in transferring property. Moreover, in the light semitransmissive layer pattern of a phase shift mask produced from the mask blank of the present invention, even when a residue defect portion, which is an unnecessary surplus portion, is formed in a region where narrow spaces and holes which each have a smaller width than in the prior art are to be made, the residue defect portion in these narrow spaces and holes can be more easily amended than when the same residue defect portion is formed in conventional light semitransmissive layer patterns each made of the same material. Specifically, when the amendment is made by a mechanical method such as a method of shaving a foreign matter with a fine needle, the fine needle is easily put into between pattern-elements; thus, a residue defect portion in such narrow spaces or holes can easily be amended.

The layer thickness of the light semitransmissive layer is not particularly limited. The layer thickness ranges preferably from 57 to 64 nm, in particular, preferably from 57 to 62 nm. As the layer thickness of the light semitransmissive layer is smaller, pattern chipping can be more remarkably restrained, this chipping being a phenomenon that a convex-element pattern as described above is chipped by cleaning the convex-element pattern by ultrasonic waves having a strong removing power in a cleaning solution. Alternatively, the light semitransmissive layer is more easily worked or the light semitransmissive layer pattern is more easily amended.

b. Extinction Coefficient and Refractive Index, and Material

The respective ranges of the extinction coefficient and the refractive index of the light semitransmissive layer at the wavelength of ArF excimer laser exposure light are gained, through calculation, as ranges permitting the layer thickness of the light semitransmissive layer that is required to give an antiphase to be set in the range of 57 to 67 nm and further permitting the transmittance of the light semitransmissive layer at the wavelength of ArF excimer laser exposure light to be set into the range of 15 to 38%. The light semitransmissive layer is a layer selected, as a novel light semitransmissive layer containing no metal, from a light semitransmissive layer made only of Si and N, and a light semitransmissive layer made only of Si, N and O. The ranges of the extinction coefficient and the refractive index of the light semitransmissive layer at the wavelength of ArF excimer laser exposure light are obtained as respective ranges of the coefficient and the index which the light semitransmissive layer made only of Si and N or made only of Si, N and O can have.

Hereinafter, a description will be made as to how to have been obtained and selected the above-mentioned respective ranges of the extinction coefficient and the refractive index of the light semitransmissive layer at the wavelength of ArF excimer laser exposure light, and the raw material of the light semitransmissive layer.

Initially, Fresnel's formula has been used to calculate out the layer thickness of a light semitransmissive layer that is necessary for giving an antiphase versus the extinction coefficient (k) value and the refractive index (n) value of the light semitransmissive layer at the wavelength of ArF excimer laser exposure light. In the present invention, the wording "antiphase" means that in a halftone phase shift mask having a transparent substrate and a light semitransmissive layer pattern formed on the transparent substrate, the following retardation ranges from 160 to 200°: the retardation between ArF excimer laser exposure light that has a wavelength of 193 nm and is transmitted only through the transparent substrate, and the laser exposure light transmitted through the transparent substrate and the light semitransmissive layer pattern.

Figure 2:
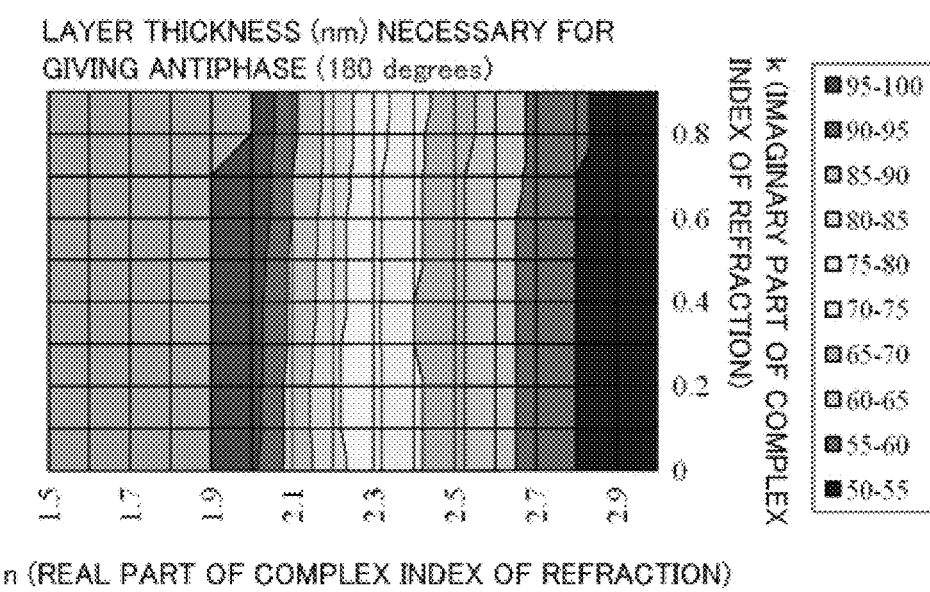
FIG. 2 is a graph representing the layer thickness (nm) of a light semitransmissive layer that is necessary for giving an antiphase having a retardation of 180° versus respective values of the extinction coefficient (k) and the refractive index (n) of the light semitransmissive layer at a wavelength of ArF excimer laser exposure light.

FIG. 2 shows a graph representing the layer thickness (nm) of the light semitransmissive layer that is necessary for giving an antiphase having a retardation of 180° versus the extinction coefficient (k) value and the refractive index (n) value of the light semitransmissive layer at a wavelength of ArF excimer laser exposure light. For example, the layer thickness of the light semitransmissive layer that is necessary for giving an antiphase having a retardation of 180° is as shown in FIG. 2 versus the values of the extinction coefficient (k) and the refractive index (n) of the light semitransmissive layer at the wavelength of ArF excimer laser exposure light. The layer thickness of the light semitransmissive layer that is necessary for giving an antiphase having a retardation other than 180° is also obtained in the same way versus the values of the extinction coefficient (k) and the refractive index (n) of the light semitransmissive layer at the wavelength of ArF excimer laser exposure light.

Figure 3:
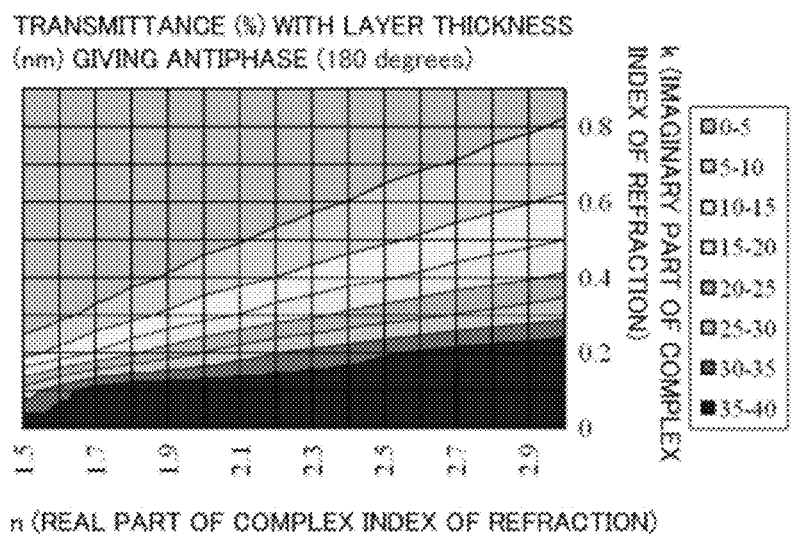
FIG. 3 is a graph representing the transmittance (%) of alight semitransmissive layer which has been made into a layer thickness necessary for giving an antiphase having a retardation of 180° versus respective values of the extinction coefficient (k) and the refractive index (n) of the light semitransmissive layer at a wavelength of ArF excimer laser exposure light.

Next, from the extinction coefficient (k), calculations have been made about the transmittance of a light semitransmissive layer at the wavelength of ArF excimer laser exposure light, this light semitransmissive layer being a layer which has been made into a layer thickness necessary for giving an antiphase, versus respective values of the extinction coefficient (k) and the refractive index (n) of the light semitransmissive layer at the wavelength of ArF excimer laser exposure light. FIG. 3 shows a graph representing the transmittance (%) of the light semitransmissive layer which has been made into a layer thickness necessary for giving an antiphase having a retardation of 180° versus respective values of the extinction coefficient (k) and the refractive index (n) of the light semitransmissive layer at the wavelength of ArF excimer laser exposure light. For example, the transmittance of the light semitransmissive layer made into a layer thickness necessary for giving an antiphase having a retardation of 180° is as shown in FIG. 3 versus the values of the extinction coefficient (k) and the refractive index (n) of the light semitransmissive layer at the wavelength of ArF excimer laser exposure light. The transmittance of the light semitransmissive layer made into a layer thickness necessary for giving an antiphase having a retardation other than 180° is obtained in the same way versus the values of the extinction coefficient (k) and the refractive index (n) of the light semitransmissive layer at the wavelength of ArF excimer laser exposure light.

Next, the following have been obtained calculated from the calculation results of the layer thickness of the light semitransmissive layer that is necessary for giving an antiphase versus the values of the extinction coefficient (k) and the refractive index (n) of the light semitransmissive layer at the wavelength of ArF excimer laser exposure light, and the calculation results of the transmittance, at the wavelength of ArF excimer laser exposure light, of the light semitransmissive layer which has been made into a layer thickness necessary for giving the antiphase: respective ranges of the extinction coefficient (k) and the refractive index (n) of the light semitransmissive layer at the wavelength of ArF excimer laser exposure light, these ranges permitting the layer thickness necessary for giving an antiphase to range from 57 to 67 nm and permitting the transmittance of the layer at the wavelength of ArF excimer laser exposure light to range from 15 to 38% when the layer is made into the layer thickness necessary for giving the antiphase.

As a result, a range of the extinction coefficient (k) from 0.2 to 0.45 and a range of the refractive index (n) from 2.3 to 2.9 have been obtained as respective ranges of the extinction coefficient (k) and the refractive index (n) of the light semitransmissive layer at the wavelength of ArF excimer laser exposure light, these ranges permitting the layer thickness necessary for giving an antiphase to range from 57 to 67 nm and permitting the transmittance of the layer at the wavelength of ArF excimer laser exposure light to range from 15 to 38% when the layer is made into the layer thickness necessary for giving the antiphase.

Next, from known materials, research and selection have been made for obtaining a material which contains no metal and has an extinction coefficient of 0.2 to 0.45 at the wavelength of ArF excimer laser exposure light and a refractive index of 2.3 to 2.9 at the wavelength of ArF excimer laser exposure light.

Figure 4:
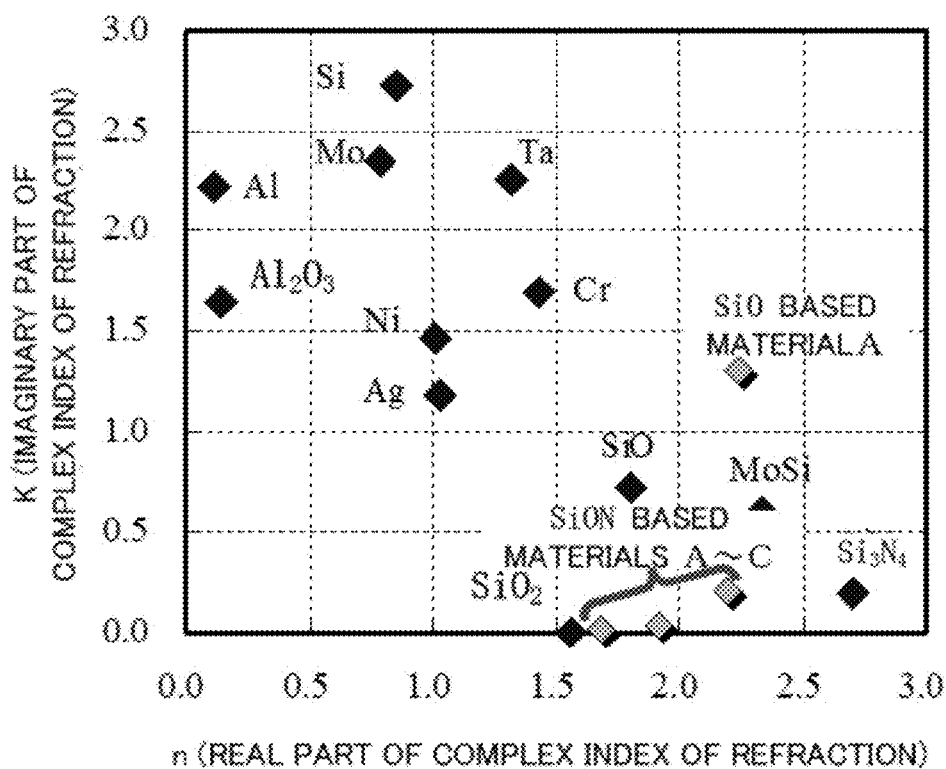
FIG. 4 is a graph representing the extinction coefficient (k) value and the refractive index (n) value of each of known materials at the wavelength of ArF excimer laser exposure light.

FIG. 4 shows a graph representing the extinction coefficient (k) value and the refractive index (n) value of each of known materials at the wavelength of ArF excimer laser exposure light. The respective extinction coefficient (k) values and refractive index (n) values of the known materials, which are represented in this graph, are described in Non Patent Literature (Refractive Index List/Refractive Index List for Thin Film Measurement [online]. [Retrieved on 2014 Jul. 3]. Retrieved from the internet: <URL: http://www.filmetricsinc.jp/refractive-index-database>) and Patent Literature (JP-A No. 2007-017998). Table 1 shows the respective extinction coefficient (k) values and refractive index (n) values of the known materials, which are represented in the graph shown in FIG. 4; and the respective in-composition ratios (% by atom) of Si (silicon), N (nitrogen), and O (oxygen) in the composition of each of the known materials.

TABLE 1

|  | n | k |  |  |
|---|---|---|---|---|
| Ag | 1.03 | 1.18 |  |  |
| Al | 0.11 | 2.22 |  |  |
| $Al_2O_3$ | 0.14 | 1.65 |  |  |
| Mo | 0.79 | 2.34 |  |  |
| Ni | 1.01 | 1.46 |  |  |
| Si | 0.85 | 2.73 |  |  |
| $Si_3N_4$ | 2.70 | 0.20 |  |  |
| $SiO_2$ | 1.56 | 0.00 |  |  |
| Ta | 1.32 | 2.26 |  |  |
| Cr | 1.43 | 1.70 |  |  |
| MoSi | 2.34 | 0.59 |  |  |
| SiO | 1.80 | 0.72 |  |  |

|  |  |  | Composition Ratio (at %) | | |
|---|---|---|---|---|---|
|  | n | k | Si | N | O |
| SiO based material A | 2.22 | 1.37 | 60.7 | 0.0 | 39.3 |
| SiON based material A | 1.68 | 0.01 | 33.4 | 4.7 | 61.9 |
| SiON based material B | 1.92 | 0.04 | 36.3 | 15.0 | 48.7 |
| SiON based material C | 2.16 | 0.21 | 38.9 | 29.6 | 31.5 |

As shown in FIG. 4 and Table 1, as a known material used for a light semitransmissive layer, $Si_3N_4$ is known, and the extinction coefficient (k) value and the refractive index (n) value of $Si_3N_4$ are 2.70 and 0.20, respectively. $Si_3N_4$ is a metal-free material having an extinction coefficient (k) of 0.2 to 0.45 and a refractive index (n) of 2.3 to 2.9.

As shown in FIG. 4 and Table 1, as known materials containing Si, O or N, known are Si (silicon), $SiO_2$, SiO, SiO based material A, SiON based material A, SiON based material B, and SiON based material C. The respective extinction coefficient (k) values and refractive index (n) values of the known materials, and the respective in-composition ratios (% by atom) of Si, N, and O in the composition of each of the known materials are as shown in FIG. 4 and Table 1.

Furthermore, in a material containing only Si and N, such as the compound $Si_3N_4$, or in a material containing only Si, N, and O, such as the material SiON based material A, SiON based material B or SiON based material C, values of the extinction coefficient (k) and the refractive index (n) thereof at the wavelength of ArF excimer laser exposure light are changed when the in-composition ratio of Si, that of N or that of O is changed. About each of these materials, it is understood from this matter how the values of the extinction coefficient (k) and the refractive index (n) tend to be changed in accordance with a change in the in-composition ratio of Si, that of N or that of O.

According to these matters, in the material containing only Si and N, or in the material containing only Si, N, and O, the extinction coefficient (k) value and the refractive index (n) value thereof at the wavelength of ArF excimer laser exposure light can be changed within the range of 0.2 to 0.45 and that of 2.3 to 2.7, respectively, by changing the in-composition ratio of Si, that of N or that of O.

From such matters, as the material of the light semitransmissive layer, a material containing only Si and N, or a material containing only Si, N, and O has been selected from known materials. As a result thereof, respective ranges of the extinction coefficient (k) and the refractive index (n) of the light semitransmissive layer at the wavelength of ArF excimer laser exposure light have been obtained as ranges into which a light semitransmissive layer made only of Si and N, or made only of Si, N and O can have. Thus, the extinction coefficient (k) and the refractive index (n) have been determined to range from 0.2 to 0.45 and from 2.3 to 2.7, respectively.

C. Light Semitransmissive Layer

The light semitransmissive layer may have a monolayered structure or a multilayered structure, and preferably has a monolayered structure since the effects and advantages of the present invention can easily be gained. Specifically, this simpler structure makes it possible to make the resultant phase shift mask pattern excellent in transferring property and high in resistance against irradiation with ArF excimer laser exposure light and cleaning resistance as described above, to avoid pattern chipping, and further to make the working of the light semitransmissive layer easier.

The light semitransmissive layer made only of Si and N is a light semitransmissive layer which does not substantially contain any element other than Si and N. However, the layer may contain any impurity as far as the impurity affects neither functions nor properties of the light semitransmissive layer. The functions and the properties of the light semitransmissive layer include the extinction coefficient and the refractive index of the light semitransmissive layer at the wavelength of ArF excimer laser exposure light. Examples of the impurity, which affects neither functions nor properties of the light semitransmissive layer, include carbon, oxygen, boron, helium, hydrogen, argon and xenon. The proportion of the impurity, which affects neither functions nor properties of the light semitransmissive layer, is preferably 5% or less, more preferably 2% or less, in particular, preferably 1% or less.

The light semitransmissive layer made only of Si, N and O is alight semitransmissive layer which does not substantially contain any element other than Si, N and O. However, the layer may contain any impurity as far as the impurity affects neither functions nor properties of the light semitransmissive layer. The functions and the properties of the light semitransmissive layer are equivalent to those of the light semitransmissive layer made only of Si and N. The kind and the proportion of the impurity, which affects neither functions nor properties of the light semitransmissive layer made only of Si, N and O, in this light semitransmissive layer are equivalent to those in the light semitransmissive layer made only of Si and N.

The light semitransmissive layer is a light semitransmissive layer made only of Si and N about which the above-mentioned refractive index ranges from 2.3 to 2.7 (high-refractive-index SiN based layer), or a light semitransmissive layer made only of Si, N and O about which the above-mentioned refractive index ranges from 2.3 to 2.7 (high-refractive-index SiON based layer). The high-refractive-index SiN based layer and the high-refractive-index SiON based layer are higher in refractive index than, for example, any light semitransmissive layer made only of Si, N and O about which the above-mentioned refractive index is less than 2.3 (low-refractive-index SiON based layer). This case makes it possible to reduce the layer thickness of the light semitransmissive layer which is a thickness for giving a retardation of 180° at the wavelength of ArF excimer laser exposure light.

Hereinafter, a description will be made in more detail about the reason why the high-refractive-index SiN based layer and the high-refractive-index SiON based layer are more preferred than the low-refractive-index SiON based layer. Table 2 shows properties of each of a high-refractive-index SiN based layer, a high-refractive-index SiON based layer, a low-refractive-index SiON based layer, and a conventional light semitransmissive layer made of MoSiON (MoSiON based layer).

TABLE 2

| | Properties | | | |
|---|---|---|---|---|
| Layer Type | Blank External Appearance Quality | Fine-pattern Chipping Resistance | Cleaning Resistance | Resistance Against Irradiation With Exposure Light |
| High-refractive-index SiN based layer | ○ | ◎ | ○ | ◎ |
| High-refractive-index SiON based layer | ○ | ◎ | ○ | ◎ |
| Low-refractive-index SiON based layer | Δ | ○ | ○ | ◎ |
| MoSiON based layer | ○ | Δ | Δ | Δ |

As shown in Table 2, the high-refractive-index SiN based layer or the high-refractive-index SiON based layer is better in fine pattern chipping resistance than the low-refractive-index SiON based layer for the following reason: the low-refractive-index SiON based layer is low in refractive index so that the layer is large in layer thickness in order to obtain a retardation of 180°; in the meantime, the high-refractive-index SiN based layer or the high-refractive-index SiON based layer can be high in refractive index so that this high-refractive-index layer can be made small in layer thickness in order to obtain a retardation of 180°. The MoSiON based layer is larger in layer thickness to obtain a retardation of 180° than the low-refractive-index SiON based layer so that the MoSiON based layer is bad in fine pattern chipping resistance.

Hereinafter, a further description will be made about effects and advantages obtained by a matter that the high-refractive-index SiN based layer or high-refractive-index SiON based layer is good in fine pattern chipping resistance. In general, in order to improve a resolving power in a wafer process of transferring, onto a wafer, a mask pattern of a halftone phase shift mask obtained from a mask blank as described above, it is necessary to heighten the transmittance of its light semitransmissive layer. In order to heighten the transmittance of the light semitransmissive layer, a means is taken for making the extinction coefficient of the light semitransmissive layer small. However, by making the extinction coefficient small, the light semitransmissive layer is lowered in refractive index to be increased in layer thickness.

The increase of the light semitransmissive layer in layer thickness makes it indispensable when a pattern of the light semitransmissive layer in the phase shift mask is made fine to clean the pattern made of the light semitransmissive layer, which is a convex-element pattern and has become tall, in a cleaning solution, using intense ultrasonic waves in the step of cleaning the phase shift mask. Consequently, pattern chipping of the light semitransmissive layer pattern, or such other problems are caused. The pattern chipping or the other problems become remarkable, particularly, in the case of targeting a limit-level high resolution, such as a resolution for forming a 10-nm-node pattern in the wafer. As will be later described, particularly, in the item "D. Method for Producing Pattern Formed Body Using Phase Shift Mask", in a wafer process of transferring a mask pattern of a phase shift mask as described above onto a wafer by negative tone development, it is necessary in the phase shift mask to form not only a main pattern, which corresponds to a fine pattern for contact holes, lines or others to be actually resolved, but also an assistant pattern, which is arranged near the main pattern not to be actually resolved, as convex-element patterns made of the light semitransmissive layer. As will be later described in the item "D. Method for Producing Pattern Formed Body Using Phase Shift Mask", such an assistant pattern is a convex-element pattern made of one or more pattern-elements (each) made light semitransmissive layer and having a width or length of 60 nm or less in advanced techniques of a wafer process. For example, in this assistant pattern, or any other convex-element pattern made of one or more pattern-elements (each) made of a light semitransmissive layer and having a width or length of 60 nm or less, pattern chipping as described above or such other problems become especially remarkable.

In other words, in order to improve the resolving power in the wafer process, it is necessary to make the transmittance of the light semitransmissive layer high. However, as the transmittance of the light semitransmissive layer is made higher, the layer thickness of the light semitransmissive layer becomes larger; thus, the promotion of a raise in the transmittance of the light semitransmissive layer conflicts with the promotion of a decrease in the layer thickness of the light semitransmissive layer, this decrease being necessary for avoiding the occurrence of the pattern chipping or the other problems in the phase shift mask in which the light semitransmissive layer pattern is made fine.

By contrast, as described above, the high-refractive-index SiN based layer or the high-refractive-index SiON based layer can become high in refractive index so that the layer can be made smaller in layer thickness than the low-refractive-index SiON based layer to be good in fine pattern chipping resistance. Moreover, the high-refractive-index SiN based layer or the high-refractive-index SiON based layer can realize the promotion of a raise in the transmittance in the same manner as the low-refractive-index SiON based layer by adjusting the in-composition ratio of Si, that of N or that of O.

Consequently, the high-refractive-index SiN based layer or the high-refractive-index SiON based layer is good in fine pattern chipping resistance to make it possible to avoid the pattern chipping or the other problems more favorably than the low-refractive-index SiON based layer. In particular, in the case of targeting a limit-level high resolution, such as a resolution for forming a 10-nm-node pattern in a wafer, the high-refractive-index layer makes it possible to avoid the pattern chipping or the other problems more favorably than the low-refractive-index SiON based layer. This matter makes it possible that the high-refractive-index SiN based layer or the high-refractive-index SiON based layer realizes the limit-level high resolution, which cannot be attained by the low-refractive-index SiON based layer because of the occurrence of the pattern chipping or the other problems.

When the assistant pattern is, particularly, a convex-element pattern made of one or more pattern-elements (each) made of the light semitransmissive layer and having a width or length of 60 nm or less in advanced techniques of a wafer process, the high-refractive-index SiN based layer or the high-refractive-index SiON based layer can more favorably avoid the pattern chipping or the other problems in a fine pattern of the assistant pattern than the low-refractive-index SiON based layer since the high-refractive-index layer is good in fine pattern chipping resistance. This matter makes it possible that the high-refractive-index SiN based layer or the high-refractive-index SiON based layer realizes a high resolution, which cannot be attained by the low-refractive-index SiON based layer because of the occurrence of the pattern chipping or the other problems.

Accordingly, the high-refractive-index SiN based layer or the high-refractive-index SiON based layer can more favorably make the promotion of a raise in the transmittance of the light semitransmissive layer compatible with the promotion of a decrease in the layer thickness of this layer than the low-refractive-index SiON based layer, thereby becoming good in fine pattern chipping resistance. Thus, the high-refractive-index layer, out of light semitransmissive layers usable in the present invention, can realize a highest resolving power.

As shown in Table 2, the high-refractive-index SiN based layer or the high-refractive-index SiON based layer is better in mask blank external-appearance-quality than the low-refractive-index SiON based layer. This is because the high-refractive-index SiN based layer or the high-refractive-index SiON based layer contains oxygen (O) in a less proportion than the low-refractive-index SiON based layer to be higher in stability of external-appearance-quality when formed, while the low-refractive-index SiON based layer contains oxygen (O) in a large proportion so that when formed, the layer easily undergoes the generation of foreign matters to be low in stability of external-appearance-quality. Although the MoSiON based layer contains oxygen in the composition thereof, the external-appearance-quality of the mask blank is made good by repeated improvements in various production conditions therefor.

Furthermore, as shown in Table 2, each of the high-refractive-index SiN based layer, the high-refractive-index SiON based layer and the low-refractive-index SiON based layer does not contain any transition metal to be higher in chemical resistance than the MoSiON based layer to be better in cleaning resistance, and is not easily denatured by irradiation with exposure light to be good in resistance against irradiation with exposure light. By contrast, the MoSiON based layer contains a transition metal to be fluctuated in dimension, retardation, transmittance and others by a large number of times of cleaning. Thus, this layer is bad in cleaning resistance. Furthermore, the transition metal is replaced by the irradiation of exposure light, so that the layer is advancingly oxidized to be fluctuated in dimension and others to be bad in resistance against irradiation with exposure light.

The in-composition ratio of Si and that of N in the light semitransmissive layer made only of Si and N, and the in-composition ratio of Si, that of O and that of N in the light semitransmissive layer made only of Si, N and O can be adjusted by selecting the following appropriately when the layers are each formed by a layer-forming method known in the prior art, such as sputtering, as will be later described: an apparatus and materials to be used, layer-forming conditions, or others. In the case of using, for example, parallel-plate-type DC magnetron sputtering apparatus to form the light semitransmissive layer onto a transparent substrate by sputtering, the adjustment can be made by selecting appropriately a target, the distance between the target and the transparent substrate (TS distance), the ratio between the gas flow rates, the gas pressures, the electric power to be applied (power) and the rotation number of the substrate, a sputtering gas such as Ar, $N_2$ or $O_2$, and other sputtering process conditions.

The light semitransmissive layer is not particularly limited, and is preferably a layer about which the above-defined extinction coefficient ranges from 0.2 to 0.4, in particular, preferably from 0.2 to 0.35. If the extinction coefficient does not reach this range, the light semitransmissive layer is high in transmittance to become small in extinction coefficient and refractive index to make a layer thickness thereof necessary for giving a predetermined retardation unfavorably large at the wavelength of ArF excimer laser exposure light. If the extinction coefficient exceeds the range, the light semitransmissive layer becomes low in transmittance not to gain a desired phase shift effect at the wavelength of ArF excimer laser exposure light.

The value of the extinction coefficient is adjustable by adjusting the in-composition ratio of Si and that of N in the light semitransmissive layer made only of Si and N, or the in-composition ratio of Si, that of O and that of N in the light semitransmissive layer made only of Si, N and O.

The extinction coefficient of the light semitransmissive layer can be measured and calculated using an ellipsometer, VUV-VASE™, manufactured by J. A. Woollam Co., Inc.

The light semitransmissive layer is not particularly limited, and is preferably a layer about which the above-defined refractive index ranges from 2.5 to 2.7, in particular, preferably from 2.6 to 2.7. If the refractive index does not reach the range, the light semitransmissive layer unfavorably increases in layer thickness for giving a retardation of 180° at the wavelength of ArF excimer laser exposure light.

The value of the refractive index is adjustable by adjusting the in-composition ratio of Si and that of N in the light semitransmissive layer made only of Si and N, or the in-composition ratio of Si, that of O and that of N in the light semitransmissive layer made only of Si, N and O.

The refractive index of the light semitransmissive layer can be measured and calculated using the ellipsometer VUV-VASE™ manufactured by J. A. Woollam Co., Inc. The refractive index can also be measured by a method of using a simulation from a reflectance curve obtained by measuring the layer by means of a spectrometer.

The light semitransmissive layer is not particularly limited, and is preferably a layer about which the above-defined transmittance ranges from 18 to 38%, in particular, preferably from 20 to 38%. If the transmittance does not reach the range, the resultant phase shift mask does not gain a desired phase shift effect. If the transmittance exceeds the range, the light-shielding property of the light semitransmissive layer is made lower than required to cause a problem about the transferring property of a desired pattern.

The value of the transmittance is adjustable by adjusting the in-composition ratio of Si and that of N in the light semitransmissive layer made only of Si and N, or the in-composition ratio of Si, that of O and that of N in the light semitransmissive layer made only of Si, N and O.

Using, for example, a phase shift quantity measuring instrument (MPM 193™, manufactured by Lasertec Corp.), measurements can be made about the transmittance of the light semitransmissive layer, the retardation between ArF excimer laser exposure light having a wavelength of 193 nm and transmitted only through the transparent substrate and the same laser exposure light transmitted through the transparent substrate and the light semitransmissive layer, and other properties.

The layer thickness of the light semitransmissive layer is not particularly limited, and ranges preferably from 57 to 64 nm, in particular, preferably from 57 to 62 nm for the following reasons: As the layer thickness of the light semitransmissive layer is smaller, pattern chipping can be more remarkably restrained, the chipping being a phenomenon that a convex-element pattern as described above is chipped by cleaning the pattern using ultrasonic waves having a strong removing power in a cleaning solution. Alternatively, the light semitransmissive layer is easily worked or the light semitransmissive layer pattern is easily amended.

The layer thickness of the light semitransmissive layer can be measured and calculated using the ellipsometer VUV-VASE™ manufactured by J. A. Woollam Co., Inc.

The light semitransmissive layer can gain an antiphase by adjusting, into the range of 160 to 200°, the retardation between ArF excimer laser exposure light having a wavelength of 193 nm and transmitted only through the transparent substrate and the same laser transmitted through the transparent substrate and the light semitransmissive layer. The light semitransmissive layer is not particularly limited. The retardation thereof is preferably from 170 to 190°, in particular, preferably 177°. When a phase shift mask is formed from the mask blank of the present invention by etching its light semitransmissive film, this preferred retardation makes it possible to adjust the following retardation into 180° in the phase shift mask even if below a region of the light semitransmissive layer where this layer is to be etched, the transparent substrate is etched to form an etched-down portion: the retardation between ArF excimer laser exposure light having the wavelength of 193 nm and transmitted through a light transmissive region where the etched-down portion is formed, and the same laser transmitted through a light semitransmissive region where the light semitransmissive layer remains. Consequently, a halftone phase shift mask can be produced.

(2) Transparent Substrate

The transparent substrate in the present invention is not particularly limited. Examples thereof include synthetic quartz glass, fluorspar, and calcium fluoride that are each optically polished to transmit the exposure light at a high transmittance. Out of these examples, synthetic quartz glass is usually preferred, which is used in many cases and has a stable quality and a high transmittance to exposure light having a short wavelength.

(3) Light-Shielding Layer

The mask blank of the present invention is not limited, particularly, about the layer structure, the material and the optical density (OD value) thereof at the wavelength of ArF excimer laser exposure light, and others as far as the mask blank has the above-defined semitransmissive layer and transparent substrate. The mask blank is preferably a mask blank further comprising a light-shielding layer that is formed on the light semitransmissive layer and the light-shielding layer has the optical density (OD value) at the wavelength of ArF excimer laser exposure light being adjusted in total to a desired optical density (OD value) when combined with an optical density (OD value) of the light semitransmissive layer.

Figure 5:
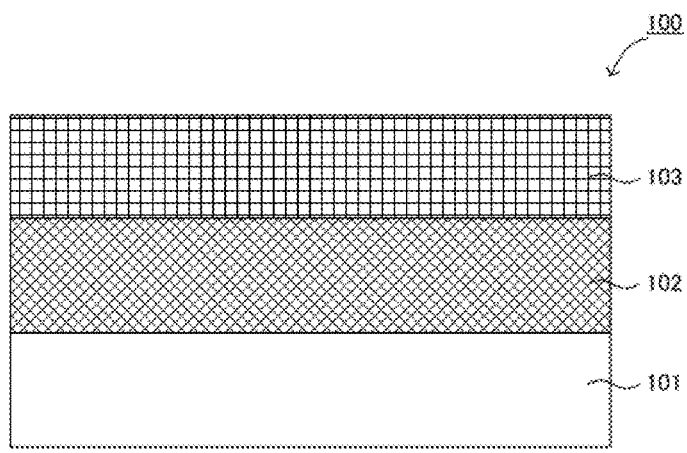
FIG. 5 is a schematic sectional view illustrating another example of the mask blank of the present invention.

FIG. 5 is a schematic sectional view illustrating another example of the mask blank of the present invention. A mask blank 100 illustrated in FIG. 5 comprises a transparent substrate 101; a light semitransmissive layer 102 formed on the transparent substrate 101 and having a monolayered structure made only of Si and N, or Si, N and O; and a light-shielding layer 103 of a monolayered structure that is formed on the light semitransmissive layer 102 and the light-shielding layer 103 has the optical density (OD value) at the wavelength of ArF excimer laser exposure light being adjusted to be in total into 3.0 or more when combined with that of the light semitransmissive layer 102. The light-shielding layer 103 has all functions of a light-absorbing function of absorbing ArF excimer laser exposure light, and an etching barrier function for the light semitransmissive layer.

When a light semitransmissive layer pattern large in area is present in a phase shift mask produced from a mask blank, a problem may be caused that the resultant transferred image may be made obscure by exposure light transmitted through the pattern. By forming a light-shielding layer pattern on a large-area pattern of the light semitransmissive layer in the present phase shift mask, an unnecessary component of exposure light that is transmitted through this light semitransmissive layer pattern is shielded to overcome this problem. When the transmittance of the light semitransmissive layer is from 15 to 38% at the wavelength of ArF excimer laser exposure light as seen in the mask blank of the present invention to be especially larger than an ordinary transmittance of 6%, this problem becomes more remarkable. Accordingly, by the matter that the present invention further has the light-shielding region, the invention can produce the effect of avoiding this problem more remarkably.

The light-shielding layer is not particularly limited as far as the layer is a layer that is formed on the light semitransmissive layer and has the optical density (OD value) at the wavelength of ArF excimer laser exposure light which being adjusted to be in total to a desired optical density (OD value) when combined with that of the light semitransmissive layer. The light-shielding layer is preferably a layer having an antireflective function of preventing multi reflection between the phase shift mask and a lens when the mask pattern is transferred onto a wafer, and an etching barrier function, for the light semitransmissive layer, of preventing the light semitransmissive layer favorably from being damaged when this layer is etched. The light-shielding layer is in particular, preferably a layer having an electroconductive function of preventing this layer from being electrically charged when an image is drawn thereon by an electron beam.

As attained in the mask blank 100 illustrated in FIG. 5, in the mask blank of the present invention, the light-shielding layer preferably has a monolayered structure comprising a light-absorbing layer formed on the light semitransmissive layer and having an etching barrier function for the light semitransmissive layer and a light-absorbing function of absorbing ArF excimer laser exposure light. This structure makes it possible to yield a mask having necessary functions through steps the number of which is smaller.

When the light-shielding layer has the monolayered structure as attained in the mask blank 100 illustrated in FIG. 5, the raw material of the light-shielding layer is not particularly limited, and is preferably, for example, Cr, Ta, W or Mo. Of these materials, for example, Cr is preferred. In this case, a reactive etching gas used when the light-shielding layer is etched is different in kind from a reactive etching gas used when the light semitransmissive layer is etched; thus, the light-shielding layer can be expected to have the above-mentioned etching barrier function.

When the light-shielding layer has the monolayered structure, the thickness of the light-shielding layer is varied in accordance with the raw material thereof not to be particularly limited. The thickness ranges preferably from 30 to 80 nm. This case makes it possible to combine the optical density (OD value) of this light-shielding layer at the wavelength of ArF excimer laser exposure light with that of the light semitransmissive layer to be easily adjusted in total into 3.0 or more. Additionally, the layer thickness makes it easy to etch the light-shielding layer.

The optical density (OD value) of this light-shielding layer pattern that is combined with that of the light semi-transmissive layer is measured and calculated out, using a product, MCPD 3000™, manufactured by Otsuka Electronics Co. Ltd.; and the reflectance of the light-shielding layer is done, using a product, MCPD 7000™, manufactured by Otsuka Electronics Co. Ltd.

Figure 6:
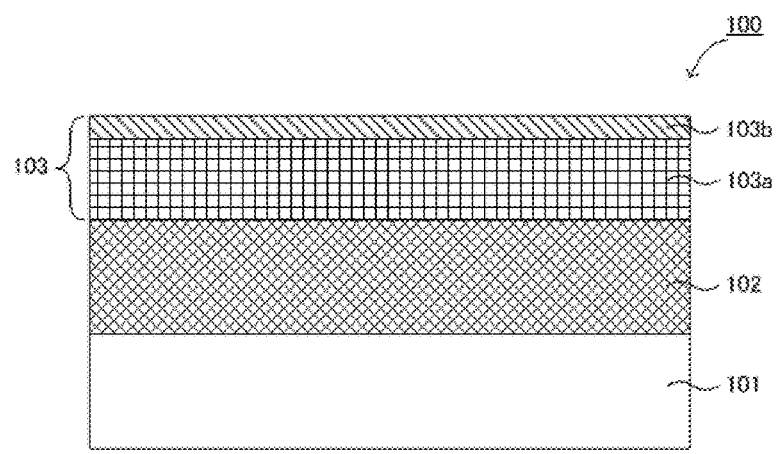
FIG. 6 is a schematic sectional view illustrating a different example of the mask blank of the invention.

FIG. 6 is a schematic sectional view illustrating still another example of the mask blank of the present invention. In a mask blank 100 illustrated in FIG. 6, a light-shielding layer 103 has a bilayered structure comprising a light-absorbing layer 103a formed on a light semitransmissive layer 102, and a hard mask layer 103b formed on the light-absorbing layer 103a. The light-absorbing layer 103a has two functions of a light-absorbing function of absorbing ArF excimer laser exposure light, and an etching barrier function for the light semitransmissive layer 102. The hard mask layer 103b has an etching barrier function for the light-absorbing layer 103a.

As attained in the mask blank 100 illustrated in FIG. 6, in the mask blank of the present invention, the light-shielding layer has a bilayered structure comprising: a light-absorbing layer formed on the light semitransmissive layer and having an etching barrier function for the light semitransmissive layer and a light-absorbing function of absorbing ArF excimer laser exposure light; and a hard mask layer formed on the light-absorbing layer and having an etching barrier function for the light-absorbing layer. This structure makes it possible to use a pattern formed by etching the hard mask layer instead of a resist pattern to be used when the light-absorbing layer is etched. Thus, the resist layer thickness can be made small. In this way, a fine pattern of the light-shielding layer can easily be formed.

More specifically, when the light-shielding layer has a monolayered structure as attained in the mask blank 100 illustrated in FIG. 5, the light-shielding layer of the monolayered structure is thick so that a thick resist pattern is used to etch the light-shielding layer to form a pattern of the light-shielding layer. It is therefore difficult, on the basis of relationship with the aspect ratio of the resist pattern, to form a fine pattern of the light-shielding layer. However, when the light-shielding layer has a bilayered structure as illustrated in FIG. 6, the hard mask layer is thinner than the light-shielding layer of the monolayered structure. Thus, using a resist pattern thinner than the resist pattern used to etch the light-shielding layer of the monolayered structure, it is possible to etch the hard mask layer to form a pattern of the hard mask layer. This pattern can be used instead of a resist pattern to be used when the light-absorbing layer is etched, so that the resist layer thickness can be made small. In this way, in the present light-shielding layer, a fine pattern can be more easily formed than in the light-shielding layer of the monolayered structure.

When the light-shielding layer has the bilayered structure, the hard mask layer is not particularly limited. The hard mask layer may have the above-mentioned electroconductive function. When the light-shielding layer has the bilayered structure, the raw material of the hard mask layer is not particularly limited as far as the raw material has an etching barrier function for the light-absorbing layer. Examples thereof include Si, SiN, SiON, $SiO_2$, MoSi, Cr, CrO, and CrON. Of these materials, preferred are Si, SiN, SiON, $SiO_2$, MoSi and others. When a raw material containing Cr is used as the raw material of the light-absorbing layer, these materials make a reactive etching gas used to etch the light-absorbing layer different in kind from a reactive etching gas used to etch the hard mask layer; thus, when the hard mask layer is etched, the light-absorbing layer can be prevented from being damaged.

When the light-shielding layer has the bilayered structure, the raw material of the light-absorbing layer is not particularly limited as far as the raw material has an etching barrier function for the light semitransmissive layer and a light-absorbing function of absorbing ArF excimer laser exposure light. Examples thereof include Cr, Si, SiO, SiON and MoSi. Of these materials, Cr is preferred. In this case, a reactive etching gas used to etch the light-absorbing layer becomes different in kind from a reactive etching gas used to etch the hard mask layer; thus, when the hard mask layer is etched, the light-absorbing layer can be prevented from being damaged. Moreover, Cr is high in extinction coefficient; thus, by the light-shielding layer made smaller in layer thickness, the optical density (OD value) of this layer at the wavelength of ArF excimer laser exposure light can be combined with that of the light semitransmissive layer to be adjusted in total into 3.0 or more.

When the light-shielding layer has the bilayered structure, the thickness of the hard mask layer is varied in accordance with the kind of the raw material thereof and not to be particularly limited. The thickness ranges preferably from 4 to 15 nm, more preferably from 4 to 10 nm, in particular, preferably from 4 to 7 nm. As the layer thickness is smaller, the layer can be worked into a better precision.

When the light-shielding layer has the bilayered structure, the thickness of the light-absorbing layer is varied in accordance with the kind of the raw material thereof and not to be particularly limited. The thickness ranges preferably from 30 to 80 nm, more preferably from 30 to 70 nm, in particular, preferably from 30 to 60 nm. As the layer thickness is smaller, the layer is more easily worked or a defective pattern of the layer is more easily amended.

Figure 7:
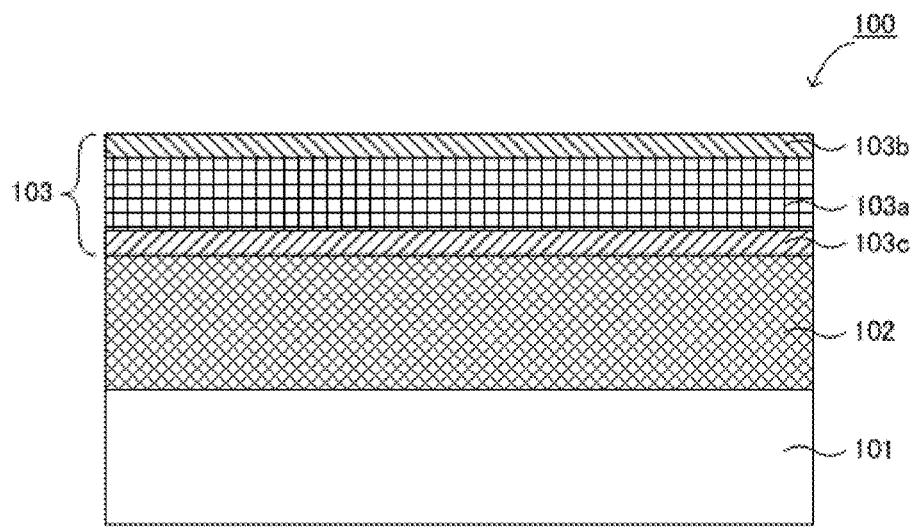
FIG. 7 is a schematic sectional view illustrating a different example of the mask blank of the invention.

FIG. 7 is a schematic sectional view illustrating a different example of the mask blank of the present invention. In a mask blank 100 illustrated in FIG. 7, a light-shielding layer 103 has a trilayered structure comprising an etching barrier layer 103c formed on a light semitransmissive layer 102, a light-absorbing layer 103a formed on the etching barrier layer 103c, and a hard mask layer 103b formed on the light-absorbing layer 103a. The etching barrier layer 103c has an etching barrier function for the light semitransmissive layer 102; the light-absorbing layer 103a has a light-absorbing function of absorbing ArF excimer laser exposure light; and the hard mask layer 103b has an etching barrier function for the light-absorbing layer 103a.

Figure 8:
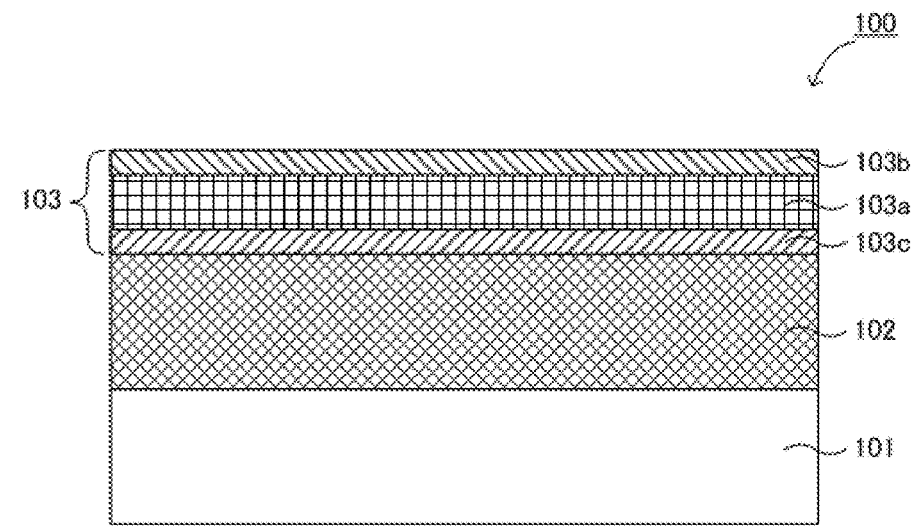
FIG. 8 is a schematic sectional view illustrating a different example of the mask blank of the invention.

FIG. 8 is a schematic sectional view illustrating a different example of the mask blank of the present invention. In a mask blank 100 illustrated in FIG. 8, a light-shielding layer 103 has a trilayered structure comprising an etching barrier layer 103c formed on a light semitransmissive layer 102, a light-absorbing layer 103a formed on the etching barrier layer 103c, and a hard mask layer 103b formed on the light-absorbing layer 103a. The etching barrier layer 103c has an etching barrier function for the light semitransmissive layer 102; the light-absorbing layer 103a has a light-absorbing function of absorbing ArF excimer laser exposure light; and the hard mask layer 103b has an etching barrier function for the light-absorbing layer 103a.

As attained in the mask blank 100 illustrated in each of FIGS. 7 and 8, in the mask blank of the present invention, its light-shielding layer preferably has a trilayered structure comprising an etching barrier layer formed on its light semitransmissive layer and having an etching barrier function for the light semitransmissive layer, a light-absorbing layer formed on the etching barrier layer and having a light-absorbing function of absorbing ArF excimer laser exposure light, and a hard mask layer formed on the light-absorbing layer and having an etching barrier function for the light-absorbing layer. In the same manner as in the case where the light-shielding layer has the bilayered structure, this case makes it possible to use a pattern formed by patterning the hard mask layer instead of a resist pattern to be used when the light-absorbing layer is etched. As a result, a fine pattern of the light-shielding layer is easily formed.

In the mask blank of the present invention, it is more preferred for the light-shielding layer to have the trilayered structure than the monolayered structure or bilayered structure. This case makes it possible to use, as the layer having a light-absorbing function of absorbing ArF excimer laser exposure light, a light-absorbing layer made of a raw material that can be etched with an etching gas high in reactivity with the light semitransmissive layer made only of Si and N, or made only of Si, N and O. Consequently, the selection flexibility of the raw material of this layer, which has a light-absorbing function of absorbing ArF excimer laser exposure light, is heightened so that the layer thickness of the light-shielding layer can be made smaller. Moreover, this layer, which has a light-absorbing function of absorbing ArF excimer laser exposure light, and a layer having an etching barrier function for the light semitransmissive layer can be rendered the light-absorbing layer and the etching barrier layer that are made of raw materials different from each other, respectively. Consequently, the light-absorbing layer and the etching barrier layer can be etched with etching gases different from each other, respectively, so that the etching barrier layer can be rendered a layer having an etching barrier function for the light semitransmissive layer to prevent the light semitransmissive layer favorably from being damaged when the light-absorbing layer is etched.

For example, in the mask blank 100 illustrated in FIG. 7, as a layer having a light-absorbing function of absorbing ArF excimer laser exposure light, the light-absorbing layer 103a that is a layer made of MoSi is usable, which is a material that can be etched with an etching gas high in reactivity with the light semitransmissive layer made only of Si and N, or made only of Si, N and O. Moreover, this layer, which has a light-absorbing function of absorbing ArF excimer laser exposure light, and a layer having an etching barrier function for the light semitransmissive layer can be rendered the light-absorbing layer 103a that is a layer made of MoSi, and the etching barrier layer 103c that is a layer made of Cr, respectively. This case makes it possible to etch the light-absorbing layer 103a and the etching barrier layer 103c with a fluorine-containing gas and a chlorine-containing gas, which are different from each other, respectively. Consequently, the etching barrier layer 103c is usable as a layer having an etching barrier function for the light semitransmissive layer 102 to prevent the light semitransmissive layer favorably from being damaged when the light-absorbing layer 103a is etched.

In the mask blank 100 illustrated in FIG. 8, as a layer having a light-absorbing function of absorbing ArF excimer laser exposure light, the light-absorbing layer 103a that is a layer made of Si is usable, which is a material that can be etched with an etching gas high in reactivity with the light semitransmissive layer made only of Si and N, or made only of Si, N and O. Moreover, this layer, which has a light-absorbing function of absorbing ArF excimer laser exposure light, and a layer having an etching barrier function for the light semitransmissive layer can be rendered the light-absorbing layer 103a that is a layer made of Si, and the etching barrier layer 103c that is a layer made of Cr, respectively. This case makes it possible to etch the light-absorbing layer 103a and the etching barrier layer 103c with a fluorine-containing gas and a chlorine-containing gas, which are different from each other, respectively. Consequently, the etching barrier layer 103c is usable as a layer having an etching barrier function for the light semitransmissive layer 102 to prevent the light semitransmissive layer favorably from being damaged when the light-absorbing layer 103a is etched.

When the light-shielding layer has the trilayered structure, the hard mask layer is not particularly limited and may have the above-mentioned electroconductive function. When the light-shielding layer has the trilayered structure, the raw material of the hard mask layer is not particularly limited as far as the raw material has an etching barrier function for the light-absorbing layer. Examples thereof include Cr, CrO, CrON, SiN, SiON, and SiO$_2$. Of these materials, Cr is preferred.

When the light-shielding layer has the trilayered structure, the raw material of the light-absorbing layer is not particularly limited as far as the raw material has the above-mentioned light-absorbing function. Examples thereof include metals such as MoSi, materials each containing silicon (Si), and simple substances each made of a metal such as W or Ta, or made of silicon (Si). Of these examples, silicon (Si) is particularly preferred. This case makes it possible to make a reactive etching gas used to etch the light-absorbing layer different in kind from a reactive etching gas used to etch the hard mask layer, thereby preventing the light-absorbing layer from being damaged when the hard mask layer is etched. Additionally, simple silicon (Si) is high in extinction coefficient; thus, the layer thickness of the light-shielding layer can be made smaller when the light-absorbing layer is made of simple silicon (Si).

When the light-shielding layer has the trilayered structure, the raw material of the etching barrier layer is not particularly limited as far as the raw material has the above-mentioned etching barrier function. Examples thereof include Cr and CrON. This case makes it possible to make a reactive etching gas used to etch the etching barrier layer different in kind from a reactive etching gas used to etch the light-absorbing layer to prevent the etching barrier layer from being damaged when the light-absorbing layer is etched. When the light-absorbing layer is etched with, for example, a fluorine-containing gas, the etching barrier layer can be prevented from being damaged, and can be etched with a chlorine-containing gas. Moreover, this case makes it possible to make a reactive etching gas used to etch the etching barrier layer different in kind from a reactive etching gas used to etch the light semitransmissive layer, thereby preventing the light semitransmissive layer from being damaged when the etching barrier layer is etched.

When the light-shielding layer has the trilayered structure, the thickness of the hard mask layer is varied in accordance with the kind of the raw material thereof and not to be particularly limited. The thickness ranges preferably from 4 to 10 nm, more preferably from 4 to 7 nm, in particular, preferably from 4 to 6 nm. This case makes it possible to cause the above-mentioned etching barrier function to exhibit sufficiently, and prevent the light-absorbing layer sufficiently from being damaged when the hard mask layer is etched.

When the light-shielding layer has the trilayered structure, the thickness of the light-absorbing layer is varied in accordance with the kind of the raw material thereof and not to be particularly limited. The thickness ranges preferably from 20 to 70 nm, more preferably from 20 to 60 nm, in particular, preferably from 30 to 50 nm. This case makes it possible to cause the above-mentioned light-absorbing function to exhibit sufficiently, and prevent the etching barrier layer from being damaged when the light-absorbing layer is etched. Moreover, the layer thickness of the light-shielding layer can be made smaller when the light-absorbing layer is made of simple Si than when the light-absorbing layer is made of MoSi since the extinction coefficient of Si is higher.

When the light-shielding layer has the trilayered structure, the thickness of the etching barrier layer is varied in accordance with the kind of the raw material thereof and not to be particularly limited. The thickness ranges preferably from 2 to 6 nm, in particular, preferably from 2 to 4 nm. In this case, the etching barrier function can be sufficiently exhibited.

The light-shielding layer is not particularly limited. The layer is a preferably a light-shielding layer about which the optical density (OD value) thereof at the wavelength of ArF excimer laser exposure light being adjusted to be in total into a value of 3.0 or more when combined with that of the light semitransmissive layer. This case makes it possible that the resultant mask can gain a light-shielding property necessary for a desired region when the mask is exposed to light.

(4) Other Members

The mask blank of the present invention is not particularly limited as far as the mask blank comprises the above-defined semitransmissive layer and transparent substrate. Thus, besides these members, any optional member may be appropriately added thereto.

The mask blank of the present invention is preferably a mask blank comprising a resist layer on the semitransmissive layer or on the light-shielding layer. Without forming any resist layer newly, this case makes it possible to form a predetermined resist pattern by development after the resist layer is exposed to light. In this way, a phase shift mask can be more easily formed from the mask blank of the present invention.

2. Structure of Mask Blank

Next, a description will be made about the structure of the mask blank of the present invention. The mask blank of the invention is a mask blank in which the above-defined light semitransmissive layer is formed on the above-defined transparent substrate. Hereinafter, the structure of the mask blank of the present invention will be described, as well as a producing method thereof.

(1) Structure of Mask Blank

The mask blank is not particularly limited, and is preferably a mask blank in which the light semitransmissive layer is formed directly on the transparent substrate.

In a light semitransmissive layer large in transmittance, such as the light semitransmissive layer in the present invention, the refractive index thereof tends to be small. Thus, in the case of attempting to produce a retardation of 180°, in a halftone phase shift mask, between a region where this light semitransmissive layer is formed and a region through which exposure light is transmitted in order to realize an appropriate phase shift, it is necessary to make the layer thickness of the light semitransmissive layer large (Patent Literatures 1 and 2). When the layer thickness of the light semitransmissive layer is made large, an etching barrier layer may be formed on the transparent substrate not to damage the transparent substrate in an etching of the light semitransmissive layer (Patent Literatures 1 and 2). As the etching barrier layer, a layer that is not etched with an etching species (such as $CF_4$ or $SF_6$ gas) for the light semitransmissive layer is formed to raise the etch selectivity between the etching barrier layer and the light semitransmissive layer. However, in the case of forming such an etching barrier layer, for example, in Patent Literature 1, a Ta—Hf layer is formed and then etched with a Cl-containing gas, as understood from Examples thereof. Thus, the etching step is performed plural times so that the etching process becomes complicated. Furthermore, the layer is not easily etched with the Cl-containing gas to cause a problem that the resultant is deteriorated in shape and uniformity. Moreover, Patent Literature 2 also describes a structure in which an etching barrier layer is made of Zr and Hf. Similarly, however, the etching step needs to be performed plural times, and the same problem based in the etching difficulty is also caused.

However, according to the present invention, the light semitransmissive layer is thinner than conventional light semitransmissive layers to be easily made into a light transmissive layer pattern by etching. This matter makes a period required for the etching short. Thus, even when the mask blank does not have an etching barrier layer between the transparent substrate and the light semitransmissive layer, the transparent substrate can sufficiently avoid being damaged when a pattern of the light semitransmissive layer is formed by the etching. Consequently, the mask blank becomes a blank in which the light semitransmissive layer is formed directly on the transparent substrate. It is therefore unnecessary to form an etching barrier layer, as described above; thus, it becomes unnecessary to perform an etching step plural times. Consequently, the etching process does not become complicated, and further the following can be prevented: a degradation of the shape of the light semitransmissive layer or the transparent substrate, and a deterioration in the evenness of the shape of the light semitransmissive layer, these inconveniences being based on difficulty in the etching of the etching barrier layer.

(2) Method for Producing Mask Blank

The method for producing the mask blank of the present invention is not particularly limited as far as the method is a method capable of yielding, as the mask blank, a desired mask blank. In an example of the method for producing the mask blank of the invention, the above-defined transparent substrate is initially prepared. Next, the above-defined light semitransmissive layer is formed onto the transparent substrate by a layer-forming method known in the prior art, such as sputtering. Next, the above-defined light-shielding layer is formed onto the light semitransmissive layer by a layer-forming method known in the prior art, such as sputtering. When the light-shielding layer has the bilayered structure, the above-defined light-absorbing layer is formed onto the light semitransmissive layer by a layer-forming method known in the prior art, such as sputtering, and subsequently the above-defined hard mask layer is formed onto the light-absorbing layer by a layer-forming method known in the prior art, such as sputtering. When the light-shielding layer has the trilayered structure, the above-defined etching barrier layer is formed onto the light semitransmissive layer by a layer-forming method known in the prior art, such as sputtering, and then the above-defined light-absorbing layer is formed onto the etching barrier layer by a layer-forming method known in the prior art, such as sputtering. Subsequently, the above-defined hard mask layer is further formed onto the light-absorbing layer by a layer-forming method known in the prior art, such as sputtering. In this way, the mask blank of the invention is yielded.

In this mask blank producing method, the method for forming the light semitransmissive layer is not particularly limited. The method is, for example, a method of using a target made of silicon (Si) as a sputtering target, selecting a sputtering gas appropriately and then using sputtering to form, as the light semitransmissive layer, a light semitransmissive layer made only of Si and N, which constitute the light semitransmissive layer, or a light semitransmissive layer made only of Si, N and O under conditions for adjusting the respective in-composition ratios thereof to desired ratios. Out of such methods, preferred is a method of using a target made of silicon (Si) as the sputtering target and using a sputtering gas which contains nitrogen but not contain oxygen at all or not contain oxygen in a large proportion to form a high-refractive-index SiN based layer or a high-refractive-index SiON based layer. This method makes it possible to form a light semitransmissive layer having excellent properties out of light semitransmissive layers as defined above. Incidentally, the high-refractive-index SiN based layer, that is, the light semitransmissive layer made only of Si and N denotes a light semitransmissive layer formed, using a target made of silicon (Si) as the sputtering target, and a sputtering gas which contains not oxygen but nitrogen in an oxygen-free atmosphere.

B. Negative-Type Resist Layer Attached Mask Blank

The following will describe the negative-type resist layer attached mask blank of the present invention. The negative-type resist layer attached mask blank of the invention comprises the above-defined mask blank and a negative-type resist layer formed on the mask blank.

Figure 9:
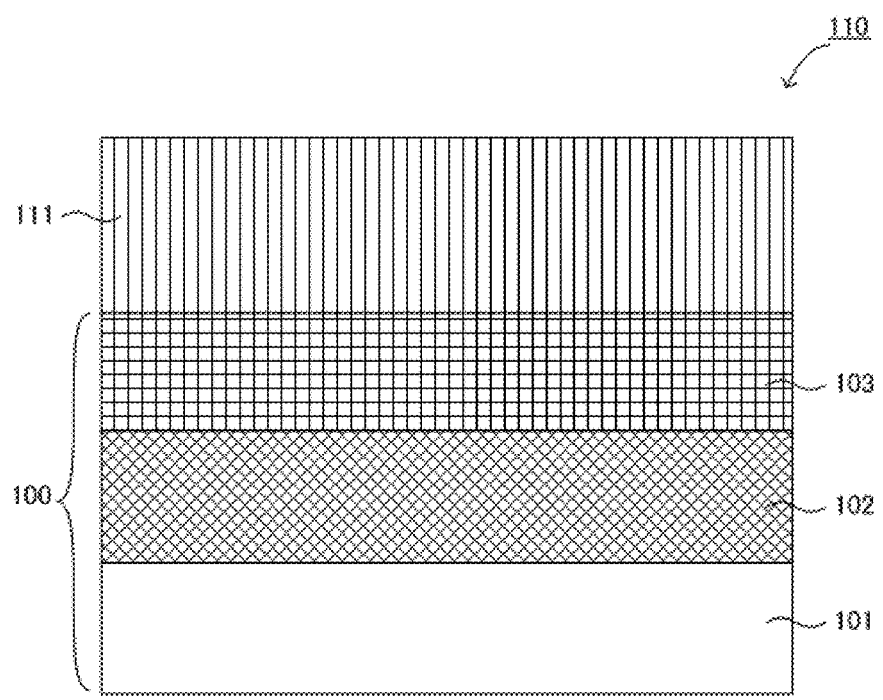
FIG. 9 is a schematic sectional view illustrating an example of the negative-type resist layer attached mask blank of the invention.

FIG. 9 is a schematic sectional view illustrating an example of the negative-type resist layer attached mask blank of the present invention. A negative-type resist layer attached mask blank 110 illustrated in FIG. 9 is a negative-type resist layer attached mask blank used to produce a halftone phase shift mask to which ArF excimer laser exposure light is to be applied. The negative-type resist layer attached mask blank 110 comprises a mask blank 100 having a transparent substrate 101, a light semitransmissive layer 102 formed on the transparent substrate 101 and having a monolayered structure made only of Si and N or made only of Si, N and O, and a light-shielding layer 103 formed on the light semitransmissive layer 102 and having a monolayered structure about which the optical density (OD value) thereof at a wavelength of ArF excimer laser exposure light being adjusted to be in total into 3.0 or more when combined with that of the light semitransmissive layer 102. The negative-type resist layer attached mask blank 110 also has a negative-type resist layer 111 formed on the mask blank 100.

As will be later described in the item "D. Method for Producing Pattern Formed Body Using Phase Shift Mask", when a halftone phase shift mask having a light semitransmissive layer is used to transfer a fine pattern for contact holes, lines or others onto a wafer, the fine pattern for the contact holes, lines or others can be transferred onto the wafer by negative tone development while a side lobe phenomenon is easily avoided.

When a fine pattern for contact holes, lines or others is transferred onto a wafer by negative tone development, it is necessary in a halftone phase shift mask to form a fine convex-element pattern made of a light semitransmissive layer and corresponding to the fine pattern for the contact holes, lines or others.

According to the present invention, by using a pattern of the above-mentioned negative-type resist layer to etch the light semitransmissive layer, a fine convex-element pattern made of the light semitransmissive layer is formed, and thus, a negative-type phase shift mask that will be later detailed can be produced. Accordingly, when the negative-type phase shift mask is produced, a light-exposure area of the negative-type resist layer in the negative-type resist layer attached mask blank becomes a very narrow area corresponding to the fine convex-element pattern made of the light semitransmissive layer. Thus, the negative-type resist layer attached mask can be produced in a shorter period.

A negative-type resist composition used to form the negative-type resist layer is not particularly limited. Examples thereof include a product, NEB-22A™, manufactured by Sumitomo Chemical Co., Ltd.; and products, SEBN-1637™, SEBN-1702 ™ and SEBN-2014™, manufactured by Shin-Etsu Chemical Co., Ltd. Of these products, preferred is the product SEBN-2014 ™ manufactured by Shin-Etsu Chemical Co., Ltd since the product is suitable for forming a finer pattern.

The layer thickness of the negative-type resist layer is not particularly limited, and ranges preferably from 50 to 150 nm, in particular, preferably from 80 to 100 nm. This case makes it possible that when a pattern is formed onto the mask, this formed pattern rendered a fine pattern while the mask blank has a sufficient etching barrier function.

The method for forming the negative-type resist layer is not particularly limited, and is, for example, painting by spin coating.

C. Phase Shift Mask

The following will describe the phase shift mask of the present invention. The phase shift mask of the invention is a halftone phase shift mask to which ArF excimer laser exposure light is to be applied. This mask comprises a transparent substrate, and a light semitransmissive layer pattern formed on the transparent substrate and made only of Si (silicon) and N (nitrogen) or a light semitransmissive layer pattern formed on the transparent substrate and made only of Si (silicon), N (nitrogen) and O (oxygen), and is characterized in that the light semitransmissive layer pattern has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light, and further has a layer thickness of 57 to 67 nm.

Figure 10:
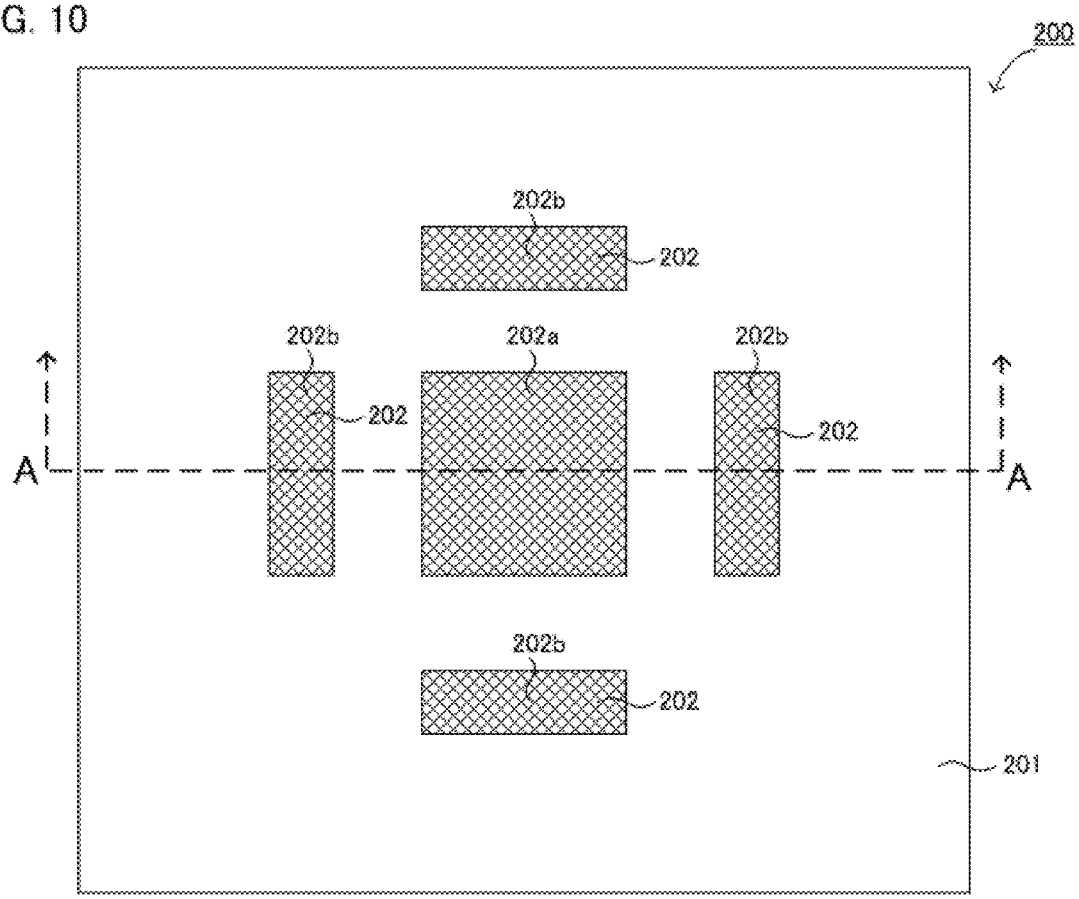
FIG. 10 is a schematic sectional view illustrating an example of the phase shift mask of the invention.
Figure 11:
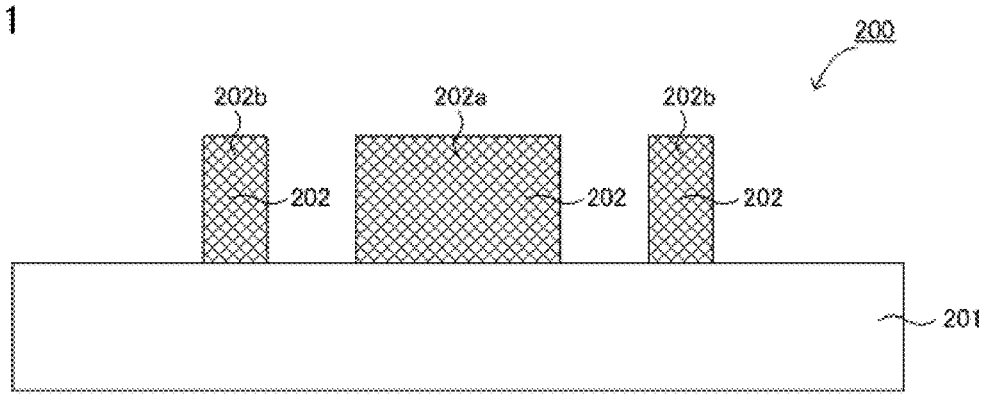
FIG. 11 is an A-A sectional view of FIG. 10.

FIG. 10 is a schematic plan view illustrating an example of the phase shift mask of the present invention. FIG. 11 is an A-A sectional view of FIG. 10. A phase shift mask 200 illustrated in FIG. 10 is a halftone phase shift mask to which ArF excimer laser exposure light is to be applied. The phase shift mask 200 illustrated in FIG. 10 comprises a transparent substrate 201, and a light semitransmissive layer pattern 202 formed on the transparent substrate 201 and having a monolayered structure made only of Si and N, or only of Si, N and O. The light semitransmissive layer pattern 202 has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light. The light semitransmissive layer pattern 202 also has a layer thickness of 57 to 67 nm. Furthermore, the light semitransmissive layer pattern 202 has a main pattern 202a which is to be resolved onto a wafer and which is a pattern-element having a width or length of 100 to 300 nm, and an assistant pattern 202b which is not to be resolved onto the wafer but assists the resolution of the main pattern 202a, and is composed of pattern-elements each having a width or length of 60 nm or less. The main pattern 202a pattern-element and the assistant pattern 202b pattern-elements are each a convex pattern-element.

Figure 12:
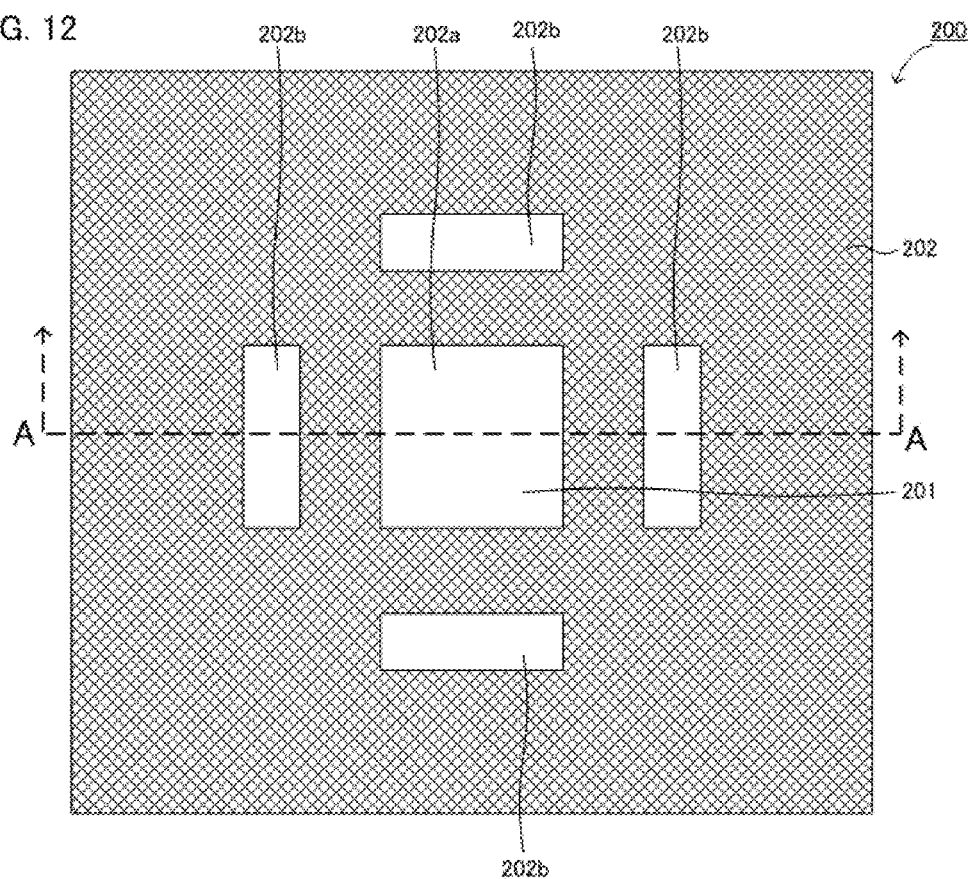
FIG. 12 is a schematic plan view illustrating another example of the phase shift mask of the invention.
Figure 13:
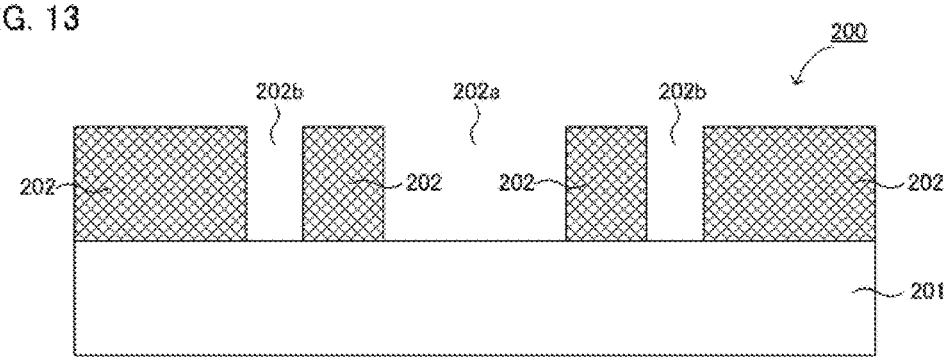
FIG. 13 is an A-A sectional view of FIG. 12.

FIG. 12 is a schematic plan view illustrating another example of the phase shift mask of the present invention. FIG. 13 is an A-A sectional view of FIG. 12. Hereinafter, a description will be made about differences of the phase shift mask 200 illustrated in FIG. 12 from the phase shift mask 200 illustrated in FIG. 10. In a light semitransmissive layer pattern 202, as a main pattern 202a which is to be resolved into a wafer and is a pattern-element having a width or length of 100 to 300 nm, a concave pattern-region obtained by hollowing out the light semitransmissive layer partially is formed; thus, the transparent substrate 201 is made naked from this pattern. In the light semitransmissive layer pattern 202, as an assistant pattern 202b which is not to be resolved onto the wafer but assists the resolution of the main pattern 202a and is composed of pattern-elements each having a width or length of 60 nm or less, concave pattern-regions each obtained by hollowing out the light semitransmissive layer partially are formed; thus, the transparent substrate 201 is made naked from the assistant pattern.

In the phase shift mask of the present invention, the light semitransmissive layer pattern has a high transmittance ranging from 15 to 38% as the transmittance thereof at the wavelength of ArF excimer laser exposure light. Accordingly, the phase shift mask of the invention is used to set, at its pattern-element boundaries, the intensity of the light to zero by light interference based on phase effect, thereby improving the resultant transferred image in contrast. Thus, when a pattern formed body is produced with this improvement, the phase effect can be made more remarkable by the high transmittance which the light semitransmissive layer pattern has. Moreover, the light semitransmissive layer pattern contains no metal; thus, no oxide layer of silicon (Si) grows even when this layer pattern is irradiated with ArF excimer laser exposure light for a long period. Consequently, the critical dimension of the pattern can be prevented from being changed. Also in the step of cleaning the phase shift mask, the critical dimension of the pattern can be similarly prevented from being changed. Accordingly, the invention makes it possible in photolithography to make the pattern of the phase shift mask excellent in transferring property and high in resistance against irradiation with ArF excimer laser exposure light and cleaning resistance.

About the phase shift mask of the present invention, the layer thickness of the light semitransmissive layer pattern ranges from 57 to 67 nm to be smaller than that of conventional light semitransmissive layer patterns. Thus, for the same reasons as described about the mask blank of the invention, in the phase shift mask of the invention, for example, chipping of its convex-element pattern as described above can be avoided, the chipping being caused by cleaning the convex-element pattern using ultrasonic waves having a strong removing power in a cleaning solution.

About the phase shift mask of the present invention, the layer thickness of the light semitransmissive layer pattern ranges from 57 to 67 nm to be smaller than that of conventional light semitransmissive layer patterns. Thus, for the same reasons as described about the mask blank of the invention, the design flexibility of the light semitransmissive layer pattern can be heightened.

About the phase shift mask of the present invention, the transmittance of the light semitransmissive layer pattern at the wavelength of ArF excimer laser exposure light ranges from 15 to 38% to be higher than in the prior art. For this reason, in particular, when a negative-type resist process or negative tone development is used in a wafer process, the phase shift mask of the invention can make the value itself of OPC bias smaller than conventional phase shift masks. Thus, in the case of using a negative-type resist process or negative tone development in order to form a fine pattern onto a wafer using the phase shift mask of the invention, the above-mentioned advantages can be remarkably obtained. In other words, by making the OPC bias value itself small, an advantage of restraining the following result from being caused can be remarkably gained: a result that when a calculation is made for an optical proximity effect correction (OPC processing) through approximate calculation in a design of the light semitransmissive layer pattern, the pattern, which is a fine pattern, on the wafer is brought into contact with some other member or separated against design intention, as described above. Consequently, the above-mentioned advantage of heightening the design flexibility of the light semitransmissive layer pattern can be remarkably obtained.

In the phase shift mask of the present invention, the layer thickness of the light semitransmissive layer pattern ranges from 57 to 67 nm to be smaller than that of conventional light semitransmissive layer patterns. Thus, for the same reasons as described about the mask blank of the invention, the transparent substrate can sufficiently avoid being damaged.

Hereinafter, about the phase shift mask of the present invention, members of the phase shift mask and the structure of the phase shift mask will be separately described.

1. Members of Phase Shift Mask

The members of the phase shift mask of the present invention will be firstly described. The phase shift mask of the invention comprises at least a transparent substrate and a light semitransmissive layer pattern.

(1) Light Semitransmissive Layer Pattern

The light semitransmissive layer pattern in the present invention is a light semitransmissive layer pattern formed on a transparent substrate which will be later detailed, and made only of Si and N, or a light semitransmissive layer pattern formed on a transparent substrate which will be later detailed, and made only of Si, N and O. The light semitransmissive layer pattern has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light. The light semitransmissive layer pattern further has a layer thickness of 57 to 67 nm.

About advanced halftone phase shift masks to which ArF excimer laser exposure light is to be applied, the positional accuracy inside the phase shift masks is very important. In the phase shift mask of the present invention, the layer thickness of the light semitransmissive layer pattern ranges from 57 to 67 nm to be smaller than that of conventional light semitransmissive layer patterns. This matter makes it possible to reduce stress applied onto the phase shift mask of the invention from the light semitransmissive layer pattern thereof. In this way, the phase shift mask can be restrained from being strained to improve the positional accuracy inside the phase shift mask.

In advanced techniques of a wafer process of transferring a mask pattern of a halftone phase shift mask having a light semitransmissive layer onto a wafer, at the time of transferring a pattern finer than conventional patterns onto a wafer, it is necessary to take, for example, the following means for restraining the shape of a wafer resist from being varied from a regular shape to decrease a variation in the dimension of the wafer from a regular dimension: measures of making this used wafer resist low in sensitivity to make the radiation period of ArF excimer laser exposure light longer than in prior art. In the meantime, a fine pattern that corresponds to the pattern finer than conventional patterns, this finer pattern being transferred onto the wafer, and that is made of the light semitransmissive layer in the phase shift mask becomes finer than in the prior art; thus, it is necessary to heighten the resistance of this finer pattern against irradiation with ArF excimer laser exposure light.

By contrast to the techniques described just above, in the phase shift mask of the present invention, the layer thickness of the light semitransmissive layer pattern ranges from 57 to 67 nm to be smaller than that of conventional light semitransmissive layer patterns. Thus, in the phase shift mask of the invention, the fine pattern made of the light semitransmissive layer becomes small in surface area. This matter decreases the adsorption of remaining-ions of a cleaning solution, and ions and organic substances from the surrounding environment onto the fine pattern. This provides a decreased risk that growing foreign matters called hazes are generated by irradiating these adsorbed foreign ions or substances with ArF excimer laser exposure light.

Accordingly, the phase shift mask of the present invention makes smaller a risk that hazes are generated in the fine pattern made of the light semitransmissive layer in the phase shift mask than conventional phase shift masks. This matter makes the following possible even when the fine pattern made of the light semitransmissive layer in the phase shift mask of the invention is made finer than in the conventional phase shift masks: the phase shift mask of the invention is rendered a mask having such a resistance against irradiation with ArF excimer laser exposure light that the mask can resist irradiation with ArF excimer laser exposure light over a longer period than in the prior art.

In the phase shift mask of the present invention, the layer thickness of the light semitransmissive layer pattern ranges from 57 to 67 nm to be smaller than that of conventional light semitransmissive layer patterns. Thus, in the phase shift mask of the invention, the light semitransmissive layer pattern becomes small in surface area, particularly, side wall area so that the mask can be improved in resistance against irradiation with ArF excimer laser exposure light and cleaning resistance (resistance against denaturation based on a cleaning chemical solution).

Conventionally, in the step of cleaning a phase shift mask used to form a 10-nm-node pattern in a wafer, cleaning conditions high in physically removing power cannot be selected in order to avoid pattern chipping of its convex-element pattern made of one or more pattern-elements (each) made of a light semitransmissive layer and having a width or length of 60 nm or less, such as an assistant pattern as described above. This matter results in a problem that it becomes difficult to remove a foreign matter trapped into a narrow space or a large foreign matter covering a line-and-space pattern of the mask. However, in the phase shift mask of the present invention, the layer thickness of the light semitransmissive layer pattern ranges from 57 to 67 nm to be smaller than that of conventional light semitransmissive layer patterns. Thus, the difference in level between concaves and convexes of its line-and-space pattern becomes small, so that a foreign matter trapped into its narrow space can easily be removed. Moreover, a large foreign matter covering the line-and-space pattern becomes small in area where this foreign matter is fitted to the pattern. Thus, any large foreign matter covering the line-and-space pattern can easily be removed.

In the phase shift mask of the present invention, the layer thickness of the light semitransmissive layer pattern ranges from 57 to 67 nm to be smaller than that of conventional light semitransmissive layer patterns. Thus, the light semitransmissive layer pattern in the phase shift mask of the invention becomes small in surface area. This matter makes it possible to shorten a period necessary for cleaning and drying the phase shift mask. The matter that the layer thickness of the light semitransmissive layer pattern is smaller than that of conventional light semitransmissive layer patterns further makes it possible to control raw-material-costs for producing the phase shift mask into a low level.

a. Convex-Element Pattern

The Light semitransmissive layer pattern is not particularly limited, and is preferably a convex-element pattern made of one or more pattern-elements (each) having a width or length of 60 nm or less. The height of the convex pattern-element(s) having a width or length of 60 nm or less ranges from 57 to 67 nm to be lower than that in conventional halftone phase shift masks. This matter decreases the area of this pattern which receives impacts based on the breaking of bubbles when the pattern is cleaned using ultrasonic waves in the step of cleaning the phase shift mask, and makes the position of this pattern which receives the impacts based on the breaking of the bubbles low. Consequently, pattern chipping of this pattern can be avoided, this chipping being caused by cleaning the pattern using ultrasonic waves having a strong removing power in a cleaning solution.

b. Main Pattern and Assistant Pattern (a) Pattern to be Transferred onto Wafer by Negative Tone Development The light semitransmissive layer pattern is not particularly limited, and may be a light semitransmissive layer pattern, as the example illustrated in FIG. 10, for transferring a fine pattern for contact holes, lines and others onto a wafer by negative tone development. As illustrated in FIG. 10, this light semitransmissive layer pattern has a main pattern to be resolved onto the wafer, and an assistant pattern which is not to be resolved onto the wafer but assists the resolution of the main pattern. The assistant pattern is a convex-element pattern made of one or more pattern-elements having (each) a width or length of 60 nm or less. The main pattern corresponds to the fine pattern to be transferred onto the wafer. When the light semitransmissive layer pattern is such a light semitransmissive layer pattern, pattern chipping can be avoided, this chipping being caused by cleaning the assistant pattern using ultrasonic waves having a strong removing power in a cleaning solution.

Incidentally, as will be later described, also in a pattern to be transferred onto a wafer by positive tone development, pattern chipping may be caused by cleaning the pattern using ultrasonic waves. In general, however, when a comparison is made between a pattern to be transferred onto a wafer by negative tone development and a pattern to be transferred onto a wafer by positive tone development, in the pattern to be transferred onto the wafer by negative tone development the length of its convex pattern-elements each having a width of 100 nm or less is shorter to make it possible to exhibit remarkably the advantage of avoiding pattern chipping caused by cleaning the pattern using ultrasonic waves.

The above-mentioned main pattern is a convex-element pattern made of the light semitransmissive layer and is to be actually resolved onto a wafer.

The assistant pattern is a convex-element pattern made of the light semitransmissive layer, and is not to be actually resolved onto the wafer. The assistant pattern is arranged at a position where diffraction light produced by the main pattern is assisted so that the exposure latitude of the mask can be improved. When the mask is defocused, a fluctuation in the critical dimension (CD) of the pattern can be decreased. Thus, the assistant pattern is a pattern capable of assisting the resolution of the main pattern onto the wafer. The width or length of one or each element of the assistant pattern ranges from 10 to 60 nm. The assistant pattern is not particularly limited, and is preferably a pattern in which one or more elements have a width or length of 20 to 60 nm, in particular, preferably 30 to 60 nm. In this case, the assistant pattern can be produced with a good yield ratio while the element(s) function(s) as an assistant pattern. However, an appropriate size of the element(s) of the assistant pattern is comprehensively determined in accordance with illuminating conditions at the time of the exposure, the size of the main pattern, and others.

(b) Pattern to be Transferred onto Wafer by Positive Tone Development

The above-mentioned light semitransmissive layer pattern is not particularly limited, and may be a light semitransmissive layer pattern for transferring a fine pattern for contact holes, lines and others onto a wafer by positive tone development, as seen in the example illustrated in FIG. 12. As seen in the example illustrated in FIG. 12, this light semitransmissive layer pattern is a pattern in which a main pattern which is to be resolved onto a wafer and an assistant pattern which assists the resolution of the main pattern and is not to be resolved onto the wafer are formed; and concave-region patterns are formed, as the main pattern and the assistant pattern, by hollowing out the light semitransmissive layer partially. The main pattern corresponds to the fine pattern to be transferred onto the wafer.

The main pattern is a pattern which is a concave-region pattern in which the light semitransmissive layer is partially hollowed out, and is to be actually resolved onto a wafer.

The assistant pattern is a concave-region pattern in which the light semitransmissive layer is partially hollowed out, and is not to be actually resolved onto the wafer. By diffraction light produced by the assistant pattern, this assistant pattern assists the resolution of the main pattern onto the wafer so that the exposure latitude of the mask can be improved. Thus, when the mask is defocused, a fluctuation in the critical dimension (CD) of the pattern can be decreased. Consequently, the assistant pattern is a pattern capable of assisting the resolution of the main pattern onto the wafer. Incidentally, it is stated herein that even in positive tone development, pattern chipping may be caused by ultrasonic wave cleaning when the clearance between the concave-regions of the concave-region pattern ranges from 10 to 100 nm, in particular from 10 to 60 nm.

c. Other Structural Factors

The structure of the light semitransmissive layer pattern in the present invention is equivalent to that of the light semitransmissive layer in the invention that has been described in the item "A. Mask Blank, 1. Members of Mask Blank, (1) Light Semitransmissive Layer" except the above-mentioned points. Thus, any description thereabout is omitted herein.

(2) Transparent Substrate

The structure of the transparent substrate in the present invention is equivalent to that of the transparent substrate in the invention that has been described in the item "A. Mask Blank, 1. Members of Mask Blank, (2) Transparent Substrate". Thus, any description thereabout is omitted herein.

(3) Light-Shielding Layer Pattern

The phase shift mask of the present invention is not particularly limited about the layer structure and the raw material thereof, the optical density (OD value) thereof at the wavelength of ArF excimer laser exposure light, and others as far as the phase shift mask comprises the above-defined transparent substrate and light semitransmissive layer pattern. The phase shift mask is preferably a mask further comprising a light-shielding layer pattern which is formed on the light semitransmissive layer pattern and is a pattern having the optical density (OD value) at the wavelength of ArF excimer laser exposure light adjusted to be in total to a desired optical density (OD value) when combined with that of the light semitransmissive layer pattern.

The structure of the light-shielding layer pattern in the present invention is equivalent to that of the light-shielding layer in the invention that has been described in the item "A. Mask Blank, 1. Members of Mask Blank, (3) Light-Shielding Layer" except that the structure is formed in a pattern form. Thus, any description thereabout is omitted herein.

(4) Other Members

The phase shift mask of the present invention is not particularly limited as far as the mask has the above-defined semitransmissive layer and transparent substrate. Other optional members may be appropriately added thereto.

2. Structure of Phase Shift Mask

The following will describe the structure of the phase shift mask of the present invention. The phase shift mask of the invention is a mask in which the above-defined light semitransmissive layer pattern is formed on the above-defined transparent substrate. Hereinafter, a description will be made about the structure of the phase shift mask of the invention, and a method for producing the mask.

(1) Structure of Phase Shift Mask

The phase shift mask is not particularly limited, and is preferably a negative-type phase shift mask.

The wording "negative-type phase shift mask" denotes a phase shift mask which is used in a negative-type resist process or negative tone development process in a wafer process, and is a mask in which monochrome-inversion pattern data are used to form a light semitransmissive layer pattern, this situation being different from that of a phase shift mask used in a wafer process using a positive-type resist.

As will be later described in the item "D. Method for Producing Pattern Formed Body Using Phase Shift Mask", when a halftone phase shift mask having a light semitransmissive layer is used to transfer, for example, a fine pattern for contact holes, lines or others onto a wafer, negative tone development makes it possible to transfer the fine pattern for the contact holes, lines or others onto the wafer while a side lobe phenomenon is easily avoided.

According to the present invention, the transmittance of the light semitransmissive layer pattern ranges from 15 to 38% at the wavelength of ArF excimer laser exposure light to be higher than in the prior art. Thus, in negative tone development, at edges of light-shielding regions corresponding to a fine pattern for contact holes, lines or others, phase effect becomes larger. This case makes it possible to transfer the fine pattern for the contact holes, lines or others more easily onto the wafer by negative tone development than conventional cases.

As will be later described in the item "D. Method for Producing Pattern Formed Body Using Phase Shift Mask", a method is known about which when a halftone phase shift mask having a light semitransmissive layer is used to transfer a fine pattern for contact holes, lines or others onto a wafer, the light semitransmissive layer is used as a raw material in the halftone phase shift mask to form not only a main pattern corresponding to the fine pattern to be actually resolved but also an assistant pattern arranged near the main pattern not to be actually resolved. This method decreases a fluctuation in the pattern critical dimension (CD) when the mask is defocused.

In advanced techniques of a wafer process of transferring, onto a wafer, a mask pattern of a halftone phase shift mask having a light semitransmissive layer, it is required to form a light semitransmissive layer pattern to adjust the width or length of an element or each element of a main pattern as described above into the range of 100 to 300 nm. Furthermore, in this case, the width or length of an element or each element of an assistant pattern as described above needs to be 60 nm or less since the assistant pattern is unfavorably resolved if the width or length is too large.

When this phase shift mask is a negative-type phase shift mask as in the present invention, the main pattern and the assistant pattern need to be formed as convex-element patterns each made of the light semitransmissive layer. Consequently, the assistant pattern becomes a convex-element pattern made of one or more pattern-elements (each) having a width or length of 60 nm or less and made of the light semitransmissive layer. Conventionally, the layer thickness of any light semitransmissive layer is large. Accordingly, for example, in the case of forming this assistant pattern, or any other convex-element pattern made of one or more pattern-elements (each) having a width or length of 60 nm or less and made of the light semitransmissive layer, in the step of cleaning the phase shift mask pattern chipping is caused, the chipping being a phenomenon that the convex-element pattern is chipped by cleaning this convex-element pattern using ultrasonic waves having a strong removing power in a cleaning solution. However, the present invention makes it possible to set the layer thickness of the light semitransmissive layer into the range of 57 to 67 nm, which is smaller than the layer thickness of conventional light semitransmissive layers. Consequently, in the phase shift mask, the height of the convex-element pattern, made of the pattern-elements which each have a width or length of 60 nm or less and are each made of the light semitransmissive layer, becomes lower than in conventional halftone phase shift masks. This matter makes it possible in the step of cleaning the phase shift mask to avoid pattern chipping, the chipping being a phenomenon that the convex-element pattern is chipped by cleaning this convex-element pattern using ultrasonic waves having a strong removing power in a cleaning solution.

The structure of the phase shift mask of the present invention is equivalent to the structure of the mask blank of the invention that has been described in the item "A. Mask Blank, 2. Structure of Mask Blank, (1) Structure of Mask Blank" except the particularly described points. Thus, any description thereabout is herein omitted.

(2) Method for Producing Phase Shift Mask

The method for producing the phase shift mask of the present invention is not particularly limited as far as the method is capable of yielding, as this mask, a desired phase shift mask. In an example of the phase shift mask producing method, as the mask blank of the invention, a mask blank having the above-defined light-shielding layer is initially prepared. Next, an electron beam resist is painted onto the light-shielding layer, and an electron beam image-drawing apparatus is used to expose the workpiece patternwise to light. The workpiece is developed with a developing solution exclusive for the resist to form a resist pattern having a desired shape. Next, the resist pattern having the desired shape is used as a mask to dry-etch the light-shielding layer in a dry etching apparatus using a desired gas, thereby working the light-shielding layer into the shape of a light semitransmissive layer pattern that will be described later. Next, the light-shielding layer worked into the light semitransmissive layer pattern shape is used as a mask to dry-etch the light semitransmissive layer to form a light semitransmissive layer pattern. Next, an electron beam resist is painted onto the light-shielding layer worked into the light semitransmissive layer pattern shape, and then an electron beam image-drawing apparatus is used to expose the workpiece patternwise to light. The workpiece is developed with a developing solution exclusive for the resist to form a resist pattern having a desired shape. Next, the resist pattern having the desired shape is used as a mask to dry-etch the light-shielding layer worked into the light semitransmissive layer pattern shape in a dry etching apparatus using a desired gas, thereby forming a light-shielding layer pattern. In this way, the phase shift mask of the present invention is obtained.

D. Method for Producing Pattern Formed Body Using Phase Shift Mask

The following will describe a method for producing a pattern formed body, using the phase shift mask of the present invention. The pattern formed body producing method using the phase shift mask of the invention is a method for producing a pattern formed body using a phase shift mask made from the above-defined mask blank, comprising the step of using the phase shift mask to form a resist pattern by negative tone development.

Figure 14A:
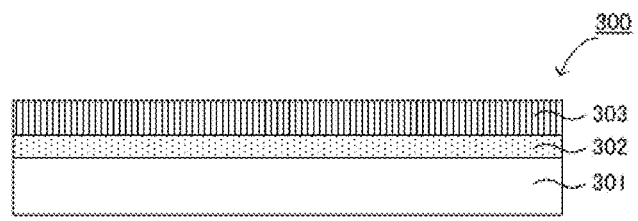
FIGS. 14A to 14C are schematic process charts illustrating an example of a method for producing a pattern formed body, using the phase shift mask of the invention.
Figure 14B:
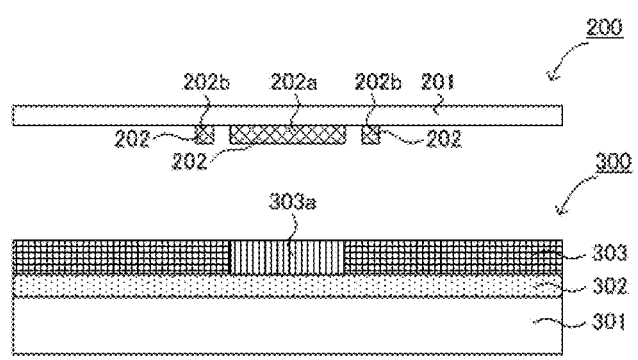
Figure 14C:
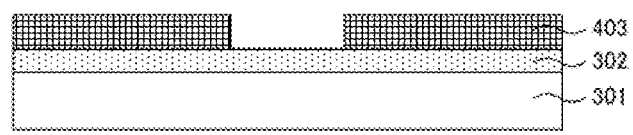

FIGS. 14A to 14C are schematic process charts illustrating an example of a method for producing a pattern formed body, using the phase shift mask of the present invention. In the pattern formed body producing method using the phase shift mask of the invention, a positive-type resist composition is initially painted directly or via a middle interposing layer 302 onto or over a substrate 301 to be worked, thereby forming a resist layer 303 on/over the substrate (FIG. 14A). Next, a phase shift mask 200 made from the mask blank of the present invention is used to expose the resist layer 303 to light (FIG. 14B).

The phase shift mask 200 illustrated in FIG. 14B is a halftone phase shift mask to which ArF excimer laser exposure light is to be applied. The phase shift mask 200 illustrated in FIG. 14B comprises a transparent substrate 201, and a light semitransmissive layer pattern 202 having a monolayered structure formed on the transparent substrate 201 and made only of Si and N, or made only of Si, N and O. The light semitransmissive layer pattern 202 has an extinction coefficient of 0.2 to 0.45 at a wavelength of ArF excimer laser exposure light, a refractive index of 2.3 to 2.7 at the wavelength of ArF excimer laser exposure light, and a transmittance of 15 to 38% at the wavelength of ArF excimer laser exposure light. The light semitransmissive layer pattern 202 also has a layer thickness of 57 to 67 nm. Furthermore, the light semitransmissive layer pattern 202 has a main pattern 202a which is to be resolved onto a wafer and has a width or length of 100 to 300 nm, and an assistant pattern 202b which is not to be resolved onto the wafer but assists the resolution of the main pattern 202a onto the wafer, and which is composed of pattern-elements each having a width or length of 60 nm or less.

Next, the resist layer 303 exposed to the light is developed with an organic solvent to dissolve and remove an unexposed region 303a of the resist layer 303, thereby forming a resist pattern 403 (FIG. 14C). Through this process, the phase shift mask 200 is used to form the resist pattern 403 by negative tone development.

A halftone phase shift mask having a light semitransmissive layer is used to transfer, for example, contact holes onto a wafer by positive tone development, edges of the contact holes can be sharply formed by phase effect. However, at a position farther than the edges of the contact holes, the shape effect becomes smaller. Thus, even a region of the light semitransmissive layer where exposure light should be shielded transmits the exposure light to cause a side lobe phenomenon that any resist layer region other than the region of the resist layer where the contact holes are to be made is sensitized with the light. A method for preventing this side lobe phenomenon is, for example, a method of laying a light-shielding layer onto the light semitransmissive layer in such a manner that no exposure light is transmitted through a region of the light semitransmissive layer where the exposure light should be shielded. However, it is necessary in this method to arrange the light-shielding layer at positions from edges of the contact holes up to a predetermined distance in order to prevent the side lobe phenomenon while phase effect is maintained at the edges of the contact holes. Specifically, it is necessary to arrange the light-shielding layer at precise positions on the basis of a predetermined rule in the state that an optical proximity correction (OPC processing) has been made. Thus, a complicated data processing needs to be attained, so that a halftone phase shift mask is not easily produced.

In the meantime, when a halftone phase shift mask having a light semitransmissive layer is used to transfer, for example, contact holes onto a wafer by negative tone development, portions of a resist composition onto which exposure light is radiated come not to be easily dissolved. Consequently, in the halftone phase shift mask, contact-hole-corresponding regions become light-shielding regions made of the light semitransmissive layer to shield exposure light. The size of the light-shielding region is only several tens nanometers on the wafer. Accordingly, even when light-shielding region portions corresponding to the contact holes transmit the light exposure, rays of the exposure light interface with each other by phase effect at the edges to be cancelled. As a result, the intensity of the exposure light becomes zero. Thus, the resist composition region portions where the exposure light should be shielded by the light-shielding region are not exposed to the light. It is therefore possible to avoid the side lobe phenomenon easily to transfer the contact holes onto the wafer.

According to the present invention, the transmittance of the light semitransmissive layer ranges from 15 to 38% at a wavelength of ArF excimer laser exposure light to be higher than that of conventional light semitransmissive layers. Thus, in negative tone development, at edges of light-shielding region portions corresponding to a fine pattern, such as one for contact holes, phase effect becomes larger. This case makes it possible to transfer the fine pattern, such as that for contact holes, more easily onto a wafer by negative tone development than conventional cases.

A method is known about which when a halftone phase shift mask having a light semitransmissive layer is used to transfer a fine pattern for contact holes, lines or others onto a wafer, the light semitransmissive layer is used as a raw material in the halftone phase shift mask to form not only a main pattern corresponding to the fine pattern to be actually resolved but also an assistant pattern arranged near the main pattern not to be actually resolved. This method makes it possible to assist a pattern resolution of the main pattern by diffraction light produced by the assistant pattern, thereby improving the exposure latitude of the mask. Thus, when the mask is defocused, a fluctuation in the pattern critical dimension (CD) can be decreased.

In advanced techniques of a wafer process of transferring, onto a wafer, a mask pattern of a halftone phase shift mask having a light semitransmissive layer, it is required when a finer pattern as described above for contact holes, lines, others are transferred onto the wafer to form, in the halftone phase shift mask, a light semitransmissive layer pattern to adjust the width or length of an element or each element of a main pattern as described above into the range of 100 to 300 nm. Furthermore, in this case, a fluctuation in the pattern critical dimension (CD) can be more largely decreased at the time of defocusing the mask as the width or length of an element or each element of an assistant pattern as described above is larger. However, if the width or length is too large, the assistant pattern is unfavorably resolved; thus, the width or length needs to be 60 nm or less.

In a wafer process of transferring, onto a wafer, a mask pattern of a halftone phase shift mask having a light semitransmissive layer by positive tone development, a main pattern and an assistant pattern as described above are formed as concave-region patterns in which the light semitransmissive layer is partially hollowed out. By contrast, in a wafer process of transferring, onto a wafer, a mask pattern of a halftone phase shift mask having a light semitransmissive layer by negative tone development, a main pattern and an assistant pattern as described above need to be formed as convex-element patterns made of the light semitransmissive layer. For this reason, the assistant pattern is a convex-element pattern made of an element or each element which has a width or length of 60 nm or less and is made of the light semitransmissive layer.

The layer thickness of conventional light semitransmissive layers is large; thus, pattern chipping is caused, which is a phenomenon that such a convex-element pattern is chipped by cleaning the convex-element pattern using ultrasonic waves having a strong removing power in a cleaning solution.

By contrast, in the mask blank of the present invention, the layer thickness of the light semitransmissive layer ranges from 57 to 67 nm to be smaller than that of conventional light semitransmissive layers. Thus, in a phase shift mask used for the pattern formed body producing method of the invention, the height of the assistant pattern, which is a convex-element pattern as described above, becomes lower than in conventional halftone phase shift masks. For this reason, in the pattern formed body producing method of the invention, pattern chipping can be avoided, the chipping being a phenomenon that the assistant pattern, which is the convex-element pattern, is chipped by cleaning this assistant pattern using ultrasonic waves having a strong removing power in a cleaning solution, for the same reasons as described about the mask blank of the invention.

In the present invention, a resist composition used to form the resist pattern is not particularly limited as far as the composition is a composition from which the resist pattern can be formed by negative tone development. The resist composition used to form the resist pattern may be a positive-type resist composition or a negative-type resist composition. The positive-type resist composition is preferred since this composition is higher in resolving power than the negative-type resist composition.

The positive-type resist composition is not particularly limited, and is, for example, a product, TOK 6063™, manufactured by Tokyo Ohka Kogyo Co., Ltd.

When the positive-type resist composition is used, a resist pattern is formed by developing the positive-type resist composition with an organic solvent developer to cause its exposed region to react with the organic solvent, thereby lowering the dissolution rate thereof, and dissolving and removing its unexposed region.

Incidentally, the present invention is not limited to the above-mentioned embodiments. The embodiments are exemplary. Any embodiment is included in the technical scope of the invention as far as the embodiment has a structure substantially equivalent to that of the technique idea recited in the claims of the invention, and produces effects and advantages equivalent to those produced from the structure.

EXAMPLES

Hereinafter, the present invention will be more specifically described by way of examples thereof, and comparative examples.

Example 1

Example 1 is a halftone phase shift mask to which ArF excimer laser exposure light is to be applied, and is a mask comprising a transparent substrate and a light semitransmissive layer pattern formed on the transparent substrate. The phase shift mask of Example 1 further comprises a light-shielding layer pattern which is formed on the light semitransmissive layer pattern and is a pattern having the optical density (OD value) at a wavelength of ArF excimer laser exposure light adjusted to be in total into 3 when combined with that of the light semitransmissive layer pattern.

In Example 1, the light semitransmissive layer pattern is made only of $Si_3N_4$. As will be later shown in Table 3, the pattern has an extinction coefficient of 0.20 at the wavelength of ArF excimer laser exposure light, and a refractive index of 2.70 at the wavelength of ArF excimer laser exposure light. As a result thereof, about the light semitransmissive layer pattern, the layer thickness necessary for giving an antiphase is 57 nm and the transmittance at the wavelength of ArF excimer laser exposure light is 38%.

Incidentally, Non Patent Literature (Refractive Index List/Refractive Index List for Thin Film Measurement [online]. [Retrieved on 2014 Jul. 3]. Retrieved from the internet: <URL: http://www.filmetricsinc.jp/refractive-index-database>) states that the extinction coefficient of $Si_3N_4$ is 0.20 at the wavelength of ArF excimer laser exposure light and the refractive index of $Si_3N_4$ is 2.70 at the wavelength of ArF excimer laser exposure light. It is therefore evident that about the present light semitransmissive layer pattern, the extinction coefficient is 0.20 at the wavelength of ArF excimer laser exposure light and the refractive index is 2.70 at the wavelength of ArF excimer laser exposure light.

Example 2

Example 2 is a halftone phase shift mask to which ArF excimer laser exposure light is to be applied, and is a mask comprising a transparent substrate and a light semitransmissive layer pattern formed on the transparent substrate. The phase shift mask of Example 2 further comprises a light-shielding layer pattern which is formed on the light semitransmissive layer pattern and is a pattern having the optical density (OD value) at the wavelength of ArF excimer laser exposure light adjusted to be in total into 3 when combined with that of the light semitransmissive layer pattern.

In Example 2, the extinction coefficient value and the refractive index value of the light semitransmissive layer pattern at the wavelength of ArF excimer laser exposure light are obtained by calculation as values permitting the layer thickness of the light semitransmissive layer pattern that is necessary for giving an antiphase to range from 57 to 67 nm, and further permitting the transmittance of the light semitransmissive layer pattern to range from 15 to 38% at the wavelength of ArF excimer laser exposure light. In Example 2, as the light semitransmissive layer pattern, the following is selected: a light semitransmissive layer pattern made only of Si and N (SiN based layer pattern); or alight semitransmissive layer pattern made only of Si, N and O (SiON based layer pattern). Furthermore, in Example 2, the extinction coefficient value and the refractive index value of the light semitransmissive layer pattern at the wavelength of ArF excimer laser exposure light are obtained as values that the light semitransmissive layer pattern made only of Si and N (SiN based layer pattern), or the light semitransmissive layer pattern made only of Si, N and O (SiON based layer pattern) can have.

In Example 2, the light semitransmissive layer pattern is made only of Si and N or made only of Si, N and O (SiN based layer pattern or SiON based layer pattern). As will be later shown in Table 3, the pattern has an extinction coefficient of 0.45 at the wavelength of ArF excimer laser exposure light, and a refractive index of 2.70 at the wavelength of ArF excimer laser exposure light. As a result thereof, about the light semitransmissive layer pattern, the layer thickness necessary for giving an antiphase is 58 nm and the transmittance at the wavelength of ArF excimer laser exposure light is 15%.

Example 3

Example 3 is different from Example 2 in that as will be later shown in Table 3, the light semitransmissive layer pattern has an extinction coefficient of 0.35 at the wavelength of ArF excimer laser exposure light, and a refractive index of 2.60 at the wavelength of ArF excimer laser exposure light. As a result thereof, Example 3 is different from Example 2 in that about the light semitransmissive layer pattern, the layer thickness necessary for giving an antiphase is 60 nm and the transmittance at the wavelength of ArF excimer laser exposure light is 20%. Example 3 is the same as the phase shift mask of Example 2 except these points.

Example 4

Example 4 is different from Example 2 in that as will be later shown in Table 3, the light semitransmissive layer pattern has an extinction coefficient of 0.30 at the wavelength of ArF excimer laser exposure light, and a refractive index of 2.50 at the wavelength of ArF excimer laser exposure light. As a result thereof, Example 4 is different from Example 2 in that about the light semitransmissive layer pattern, the layer thickness necessary for giving an antiphase is 63 nm and the transmittance at the wavelength of ArF excimer laser exposure light is 25%. Example 4 is the same as the phase shift mask of Example 2 except these points.

Example 5

Example 5 is different from Example 2 in that as will be shown in Table 3, the light semitransmissive layer pattern has an extinction coefficient of 0.25 at the wavelength of ArF excimer laser exposure light, and a refractive index of 2.40 at the wavelength of ArF excimer laser exposure light. As a result thereof, Example 5 is different from Example 2 in that about the light semitransmissive layer pattern, the layer thickness necessary for giving an antiphase is 67 nm and the transmittance at the wavelength of ArF excimer laser exposure light is 30%. Example 5 is the same as the phase shift mask of Example 2 except these points.

Comparative Example 1

Comparative Example 1 is a halftone phase shift mask to which ArF excimer laser exposure light is to be applied, and is a mask comprising a transparent substrate and a light semitransmissive layer pattern formed on the transparent substrate. The phase shift mask of Comparative Example 1 further comprises a light-shielding layer pattern which is formed on the light semitransmissive layer pattern and is a pattern having the optical density (OD value) at a wavelength of ArF excimer laser exposure light adjusted to be in total into 3 when combined with that of the light semitransmissive layer pattern.

In Comparative Example 1, the light semitransmissive layer pattern is made of MoSiON based material. As will be shown in Table 3, the pattern has an extinction coefficient of 0.59 at the wavelength of ArF excimer laser exposure light, and a refractive index of 2.34 at the wavelength of ArF excimer laser exposure light. As a result thereof, about the light semitransmissive layer pattern, the layer thickness necessary for giving an antiphase is 68 nm and the transmittance at the wavelength of ArF excimer laser exposure light is 6%.

Incidentally, in Examples 1 to 5, it is presupposed that their light-shielding layer is a layer made of a Cr simple substance. However, as illustrated in each of FIGS. 6 and 7, when the light-shielding layer is composed of plural layers such as two layers or three layers, the same phase shift mask as described above can be produced by selecting an etching gas, etching conditions, and others appropriately to etch each of the layers.

[Evaluation 1]

About the phase shift masks of Examples 1 to 5, and Comparative Example 1, the maximum value (maxEL) of the exposure latitude and the maximum value (maxDoF) of the depth of focus were evaluated through simulations. Specifically, under simulation evaluating conditions described below, the evaluations were made by calculations using Kirchhoff's method as an algorithm for gaining the respective transferring properties of the patterns of the masks, and a product, EM-Suite™, manufactured by Panoramic Technology Inc. as a simulation software.

<Simulation Evaluating Conditions>

NA: 1.35
Sigma: c-quad 0.95/0.80-30 deg
Polarization: X/Y
Target: 60 nm HOLE (NTD)
Pitch: each of 180, 240 and 300 nm The NA, sigma, and polarization were adopted as effective illuminating conditions usable realistically to transfer a shape of the target (60 nm HOLE (NTD)) and the pitch (each of 180, 240 and 300 nm). The evaluation results are shown in Table 3 described below. About the phase shift mask of each of Examples 1 to 5 and Comparative Example 1, Table 3 also shows the raw material of the light semitransmissive layer pattern, the refractive index (n) and the extinction coefficient (k) of the light semitransmissive layer pattern at the wavelength of ArF excimer laser exposure light, the layer thickness (d) of the light semitransmissive layer pattern for giving an antiphase, and the transmittance (trans) of the light semitransmissive layer pattern at the wavelength of ArF excimer laser exposure light.

TABLE 3

| | Raw Material | n | k | d | Trans [%] | max EL [%] | max DoF [um] |
|---|---|---|---|---|---|---|---|
| Example 1 | Si$_3$N$_4$ | 2.70 | 0.20 | 57 nm | 38 | 8.95 | 0.052 |
| Example 2 | SiN based or SiON based | 2.70 | 0.45 | 58 nm | 15 | 8.23 | 0.049 |
| Example 3 | SiN based or SiON based | 2.60 | 0.35 | 60 nm | 20 | 8.51 | 0.050 |
| Example 4 | SiN based or SiON based | 2.50 | 0.30 | 63 nm | 25 | 9.23 | 0.051 |
| Example 5 | SiN based or SiON based | 2.40 | 0.25 | 67 nm | 30 | 9.15 | 0.053 |
| Comparative Example 1 | MoSiON based | 2.34 | 0.59 | 68 nm | 6 | 7.69 | 0.047 |

[Evaluation 2]

Figure 15:
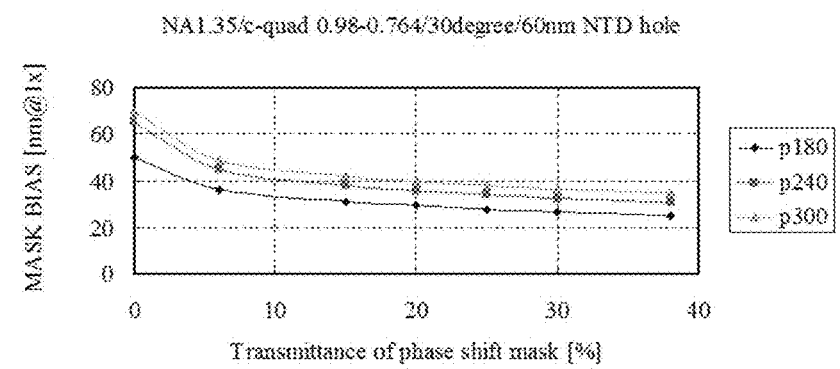
FIG. 15 is a graph representing OPC bias value simulation results versus transmittance.

FIG. 15 is a graph representing a simulation result of the OPC bias value of each of the phase shift masks versus the transmittance thereof.

From FIG. 15, it is understood that in an appropriate illuminating system for 1× node, the OPC bias value of the phase shift masks in each of which the transmittance of the light semitransmissive layer is 15% or more is smaller than the phase shift mask of Comparative Example 1, in which the transmittance of the light semitransmissive layer is 6%.

[Evaluation 3]

Figure 16:
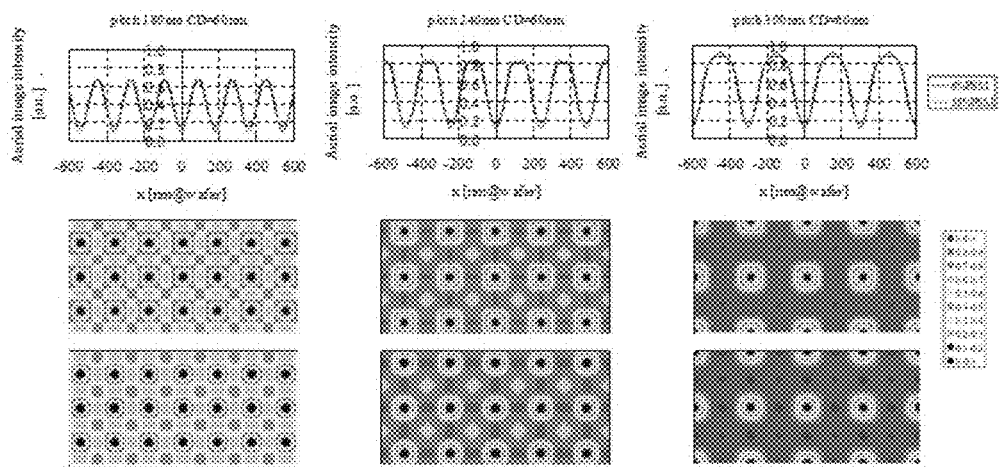
FIG. 16 is a chart which shows XY images of exposure light intensity distributions each existing on a wafer, the distributions being gained by a simulator, and which further shows graphs that each represent the respective exposure light intensities of the distributions.

FIG. 16 is a chart which shows respective XY images of exposure light intensity distributions each existing on a wafer, the distributions being gained by a simulator, and which further shows graphs each representing the respective exposure light intensities of the distributions. The XY images shown at the lower positions of FIG. 16 are respective XY images of the exposure light intensity distributions, which each exist on the wafer, the distributions being obtained by calculation about each of phase shift masks and further about each of its difference pitches. The graphs shown at the upper in FIG. 16 are each a graph representing the intensity of the exposure light transmitted through each of the phase shift masks at each position along the transverse axis of the XY image of the exposure light intensity distribution shown at the lower position provided that the intensity of the exposure light not transmitted through the light semitransmissive layer is regarded as 1.0.

From FIG. 16, it is understood that about the individual pitches, the image contrast calculated under conditions of supposing one of the phase shift masks described just above, in which the transmittance of the light semitransmissive layer is 38%, is higher than that calculated under conditions of supposing the other of the phase shift masks, in which the transmittance of the light semitransmissive layer is 6%.

[Evaluation 4]

Figures 1, 17:
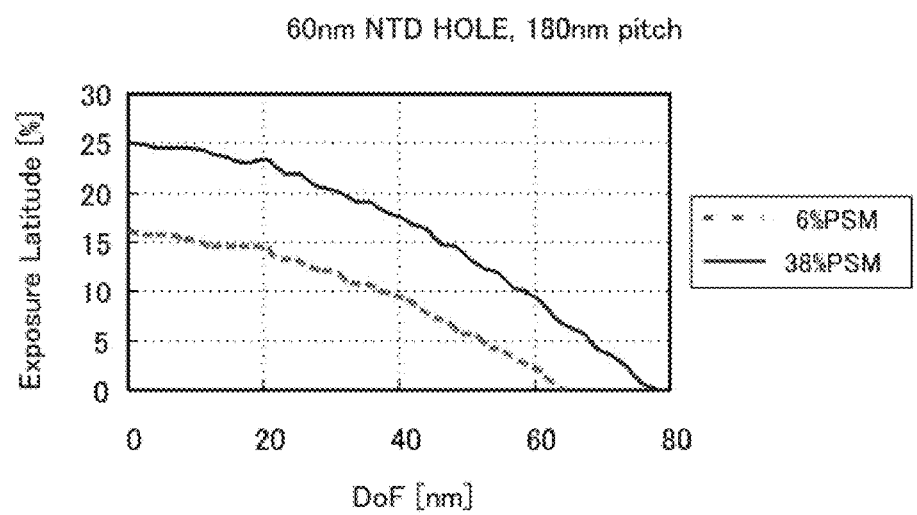
Figures 2, 17:
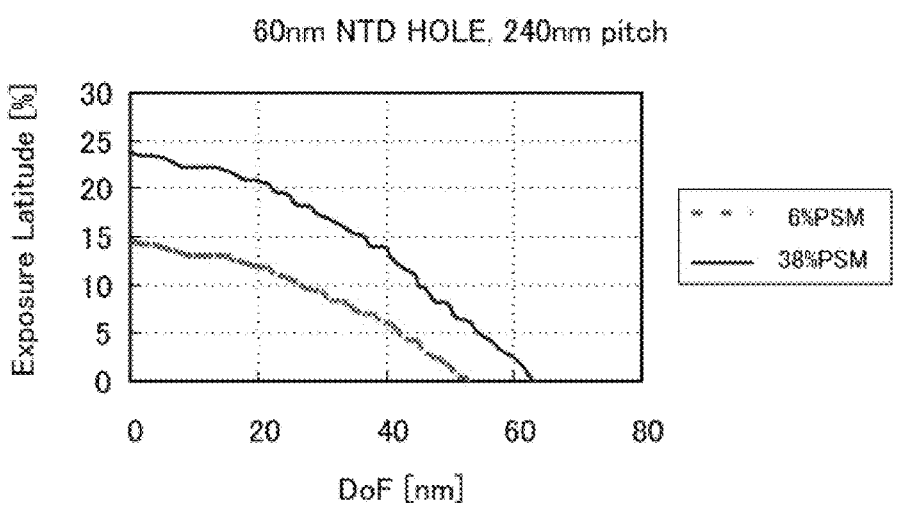
Figures 3, 17:
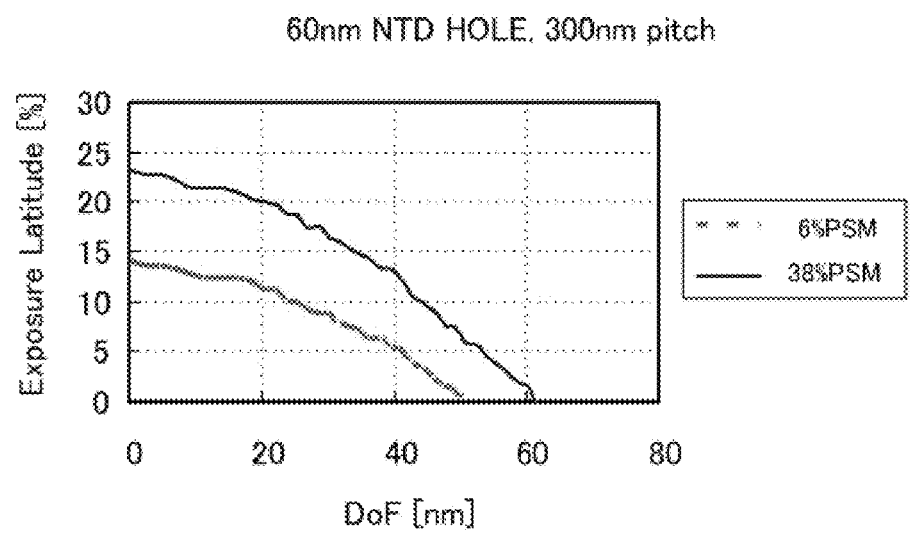

FIG. 17-1 to FIG. 17-3 are each a graph representing, as simulation results, a relationship between the depth of focus and the exposure latitude of the phase shift mask of each of Example 1 and Comparative Example 1 when the pattern is transferred. The graphs shown in FIG. 17-1 to FIG. 17-3 are graphs about the phase shift masks in which the hole pitch is 180 nm, 240 nm, and 300 nm, respectively, and in which their transverse axis represents the depth of focus (DOF) and their vertical axis represents the exposure latitude (EL). The EL (%) when the DOF is 0 nm is shown in Table 4, and the DOF (nm) when the EL is 10% is shown in Table 5.

TABLE 4

| Pitch | 180 nm | 240 nm | 300 nm |
|---|---|---|---|
| 6% PSM | 16.08 | 14.43 | 14.00 |
| 38% PSM | 25.13 | 23.80 | 23.28 |
| EL Improvement Ratio | 56% | 65% | 66% |

TABLE 5

| Pitch | 180 nm | 240 nm | 300 nm |
|---|---|---|---|
| 6% PSM | 37.2 | 26.5 | 24.0 |
| 38% PSM | 58.7 | 45.3 | 44.3 |
| DOF Improvement Ratio | 58% | 71% | 85% |

It is understood from FIG. 17-1, and Tables 4 and 5 that in a case where the pitch is 180 nm, about the EL when the DOF is 0 nm, the calculation result of the mask in which the transmittance is 38% is approximately 56% larger than that of the mask in which the transmittance is 6%; and about the DOF when the EL is 10%, the calculation result of the mask in which the transmittance is 38% is approximately 58% larger than that of the mask in which the transmittance is 6%. It is understood from FIG. 17-2, and Tables 4 and 5 that also in a case where the pitch is 240 nm, about the EL when the DOF is 0 nm, the calculation result of the mask in which the transmittance is 38% is 65% larger than that of the mask in which the transmittance is 6%; and about the DOF when the EL is 10%, the calculation result of the mask in which the transmittance is 38% is 71% larger than that of the mask in which the transmittance is 6%. Furthermore, it is understood from FIG. 17-3, and Tables 4 and 5 that also in a case where the pitch is 300 nm, about the EL when the DOF is 0 nm, the calculation result of the mask in which the transmittance is 38% is 66% larger than that of the mask in which the transmittance is 6%, and that about the DOF when the EL is 10%, the calculation result of the mask in which the transmittance is 38% is 85% larger than that of the mask in which the transmittance is 6%.

It is therefore understood that the calculation results of the mask in which the transmittance is 38% are larger in both of DOF and EL than those of the mask in which the transmittance is 6%.

[Evaluation 5]

Figure 18:
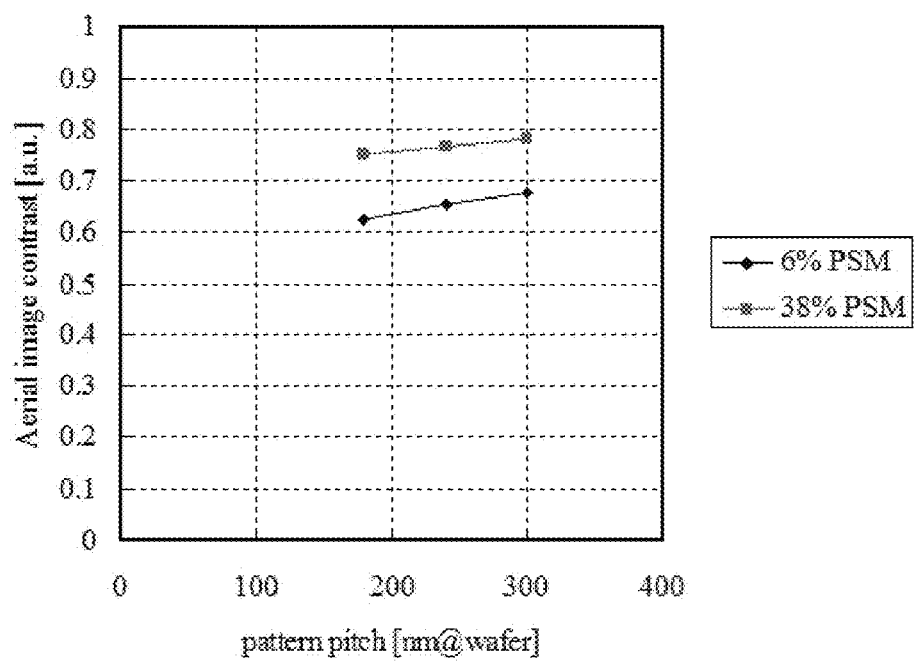
FIG. 18 is a graph representing the contrast of wafer-transferred spatial optical images that results from calculation under conditions of supposing each of a phase shift mask in which the transmittance of the light semitransmissive layer is 38% and a phase shift mask in which the transmittance of the light semitransmissive layer is 6%.

FIG. 18 is a graph representing the contrast of wafer-transferred spatial optical images that results from calculation under conditions of supposing each of the phase shift mask in which the transmittance of the light semitransmissive layer is 38% and the phase shift mask in which the transmittance of the light semitransmissive layer is 6%. In the graph in FIG. 18, its transverse axis represents the pitch of the pattern formed on the wafer, and its vertical axis represents the image contrast.

It is understood from FIG. 18 that about each of the pitches of the pattern formed on the wafer, the phase shift mask in which the transmittance of the light semitransmissive layer is 38% is larger in image contrast than the phase shift mask in which the transmittance of the light semitransmissive layer is 6%. In other words, it is demonstrated that the larger image contrast results in the following: even when the exposure quantity is changed (the spatial images are changed in slice level), a variation in the critical dimension of the pattern formed on the wafer is favorably small (the EL is large).

[Evaluation 6]

Figure 19:
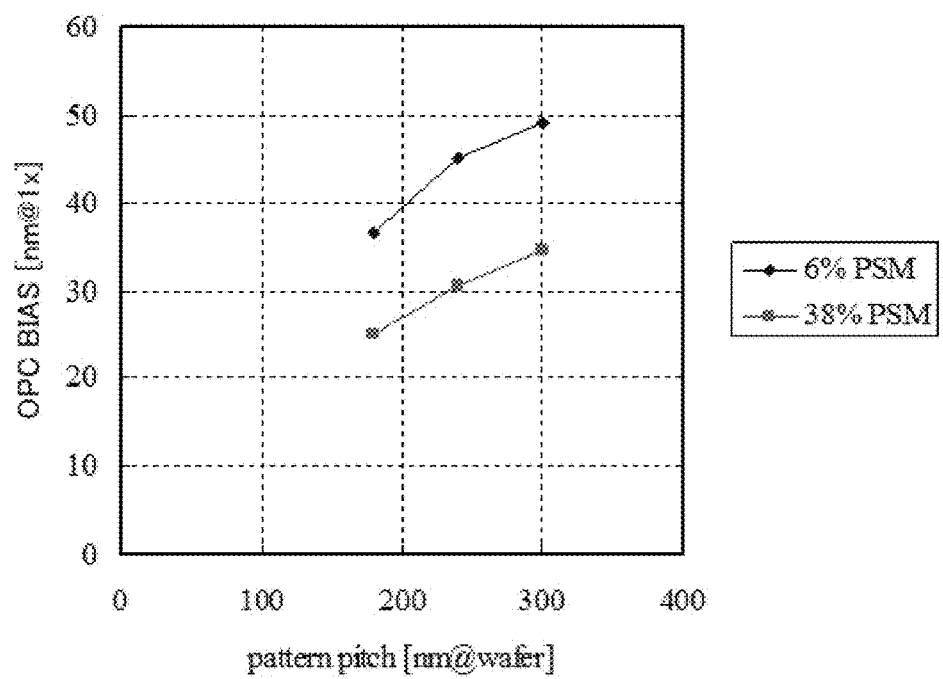
FIG. 19 is a graph representing the OPC bias of a phase shift mask that results from calculation under conditions of supposing each of the phase shift mask in which the transmittance of the light semitransmissive layer is 38% and the phase shift mask in which the transmittance of the light semitransmissive layer is 6%.

FIG. 19 is a graph representing the OPC bias that results from calculation under conditions of supposing each of the phase shift mask in which the transmittance of the light semitransmissive layer is 38% and the phase shift mask in which the transmittance of the light semitransmissive layer is 6%. In the graph in FIG. 19, its transverse axis represents the pitch of the pattern formed on the wafer, and its vertical axis represents the pattern critical dimension (CD) of the phase shift mask with the OPC bias.

It is understood from FIG. 19 that about each of the pitches of the pattern formed on the wafer, the phase shift mask in which the transmittance of the light semitransmissive layer is 38% is smaller in pattern critical dimension (CD) of the mask with the OPC bias than the mask in which the transmittance of the light semitransmissive layer is 6%. In other words, it is demonstrated that the smaller OPC bias makes it possible to form a finer pattern onto the wafer, thereby heightening the design flexibility of a pattern to be formed onto the wafer.

[Evaluation 7]

Respective light semitransmissive layer patterns of phase shift masks of the present invention were evaluated about chipping resistance. Specifically, before and after each of phase shift masks which each have a light semitransmissive layer pattern having approximately one billion convex pattern-elements was cleaned using ultrasonic waves in a cleaning solution, a mask inspecting apparatus was used to make a comparison inspection. According to this inspection, before and after the cleaning, it was inspected whether or not the convex pattern-elements were chipped. The number of the chips of the convex pattern-elements was counted, and the size of the chips of the convex pattern-elements was checked.

The light semitransmissive layer patterns evaluated about chipping resistance had two layer thicknesses (60 nm and 75 nm), respectively. The chipping-resistance-evaluated light semitransmissive layer patterns having any one of the layer thicknesses had six-size convex pattern-elements (width× length: 60 nm×150 nm, 60 nm×300 nm, 60 nm×600 nm, 85 nm×150 nm, 85 nm×300 nm, and 85 nm×600 nm), respectively. The chipping resistance evaluation was made under cleaning conditions described below. Incidentally, a high level out of two levels of ultrasonic conditions had a physically removing power two times larger than a low level.

<Cleaning Conditions>

Cleaning condition: ultrasonic wave cleaning

Ultrasonic conditions: two levels (low and high levels)

The number of times of the cleaning: estimation of the number at intervals of five times About the light semitransmissive layer patterns each having the layer thickness of 60 nm, Table 6 shows results obtained by inspecting whether or not their cleaned convex-element pattern was chipped. About each of the sizes of the convex pattern-elements, Table 6 shows whether or not the convex pattern-elements were chipped under each of the ultrasonic conditions. In Table 6, any case where convex-element pattern chipping was generated is represented by X; and any case where convex-element pattern chipping was not generated is represented by ○.

TABLE 6

| Convex pattern-element size | | | Ultrasonic conditions | |
|---|---|---|---|---|
| Layer Thickness (nm) | Width (nm) | Length (nm) | Low level | High level |
| 60 | 60 | 150 | ○ | ○ |
| 60 | 60 | 300 | ○ | ○ |
| 60 | 60 | 600 | ○ | ○ |
| 60 | 85 | 150 | ○ | ○ |
| 60 | 85 | 300 | ○ | ○ |
| 60 | 85 | 600 | ○ | ○ |

In the same manner, about the light semitransmissive layer patterns each having the layer thickness of 75 nm, Table 7 shows results obtained by inspecting whether or not their cleaned convex-element pattern was chipped. About each of the sizes of the convex pattern-elements, Table 7 shows whether or not the convex pattern-elements were chipped under each of the ultrasonic conditions. In Table 7, any case where convex-element pattern chipping was generated is represented by X; and any case where convex-element pattern chipping was not generated is represented by ○.

TABLE 7

| Convex pattern-element size | | | Ultrasonic conditions | |
|---|---|---|---|---|
| Layer Thickness (nm) | Width (nm) | Length (nm) | Low level | High level |
| 75 | 60 | 150 | ○ | X |
| 75 | 60 | 300 | ○ | X |
| 75 | 60 | 600 | ○ | X |
| 75 | 85 | 150 | ○ | ○ |
| 75 | 85 | 300 | ○ | ○ |
| 75 | 85 | 600 | ○ | ○ |

It is understood from Table 6 that about the light semitransmissive layer patterns each having the layer thickness of 60 nm, the convex pattern-elements of all the sizes are not chipped under both of the ultrasonic conditions. In the meantime, it is understood from Table 7 that about the light semitransmissive layer patterns each having the layer thickness of 75 nm, the convex pattern-elements of the 60-nm-width sizes are chipped under the high-level ultrasonic condition. The incidence ratio of the convex pattern-element chipping was from several parts per billion to several tens of parts per billion.

It is understood from such results that when the layer thickness of a light semitransmissive layer pattern, such as the light semitransmissive layer pattern of the phase shift mask of Example 3, is 60 nm (within the range of 57 to 67 nm), pattern chipping can be avoided, the chipping being a phenomenon that its convex pattern-elements each having a width or length of 60 nm (60 nm or less) and made of the light semitransmissive layer are cleaned using ultrasonic waves having a strong removing power in a cleaning solution so that the convex pattern-elements are chipped. In the meantime, it is understood that when the layer thickness of a light semitransmissive layer pattern is 75 nm (out of the range of 57 to 67 nm), pattern chipping cannot be avoided, the chipping being a phenomenon that its convex pattern-elements each having a width or length of 60 nm (60 nm or less) and made of the light semitransmissive layer are cleaned using ultrasonic waves having a strong removing power in a cleaning solution so that the convex pattern-elements are chipped.

REFERENCE SIGNS LIST

100: Mask blank, 101: transparent substrate, 102: light semitransmissive layer, 103: light-shielding layer, 110: negative-type resist layer attached mask blank, 200: phase shift mask, 201: transparent substrate, and 202: light semitransmissive layer pattern.

The invention claimed is:

1. A mask blank used to produce a halftone phase shift mask to which ArF excimer laser exposure light is to be applied,
the mask blank comprises a transparent substrate, and a light semitransmissive layer formed on the transparent substrate and made only of Si and N or a light semitransmissive layer formed on the transparent substrate and made only of Si, N and O,
wherein the light semitransmissive layer has an extinction coefficient of 0.2 to 0.45 at a wavelength of ArF excimer laser exposure light, a refractive index of 2.3 to 2.7 at the wavelength of ArF excimer laser exposure light, and a transmittance of 15% to 38% at the wavelength of ArF excimer laser exposure light, and further has a layer thickness of 57 nm to 67 nm.

2. The mask blank according to claim 1, wherein the light semitransmissive layer is formed directly on the transparent substrate.

3. The mask blank according to claim 1, further comprising a light-shielding layer formed on the light semitransmissive layer, an optical density (OD value) of this light-shielding layer at the wavelength of ArF excimer laser exposure light being adjusted to be in total to a desired optical density (OD value) when combined with an optical density (OD value) of the light semitransmissive layer.

4. The mask blank according to claim 3, wherein the light-shielding layer has a monolayered structure comprising a light-absorbing layer formed on the light semitransmissive layer and having an etching barrier function for the light semitransmissive layer and a light-absorbing function of absorbing the ArF excimer laser exposure light.

5. The mask blank according to claim 3, wherein the light-shielding layer has a bilayered structure comprising: a light-absorbing layer formed on the light semitransmissive layer and having an etching barrier function for the light semitransmissive layer and a light-absorbing function of absorbing the ArF excimer laser exposure light; and a hard mask layer formed on the light-absorbing layer and having an etching barrier function for the light-absorbing layer.

6. The mask blank according to claim 3, wherein the light-shielding layer has a trilayered structure comprising: an etching barrier layer formed on the light semitransmissive layer and having an etching barrier function for the light semitransmissive layer; a light-absorbing layer formed on the etching barrier layer and having a light-absorbing function of absorbing the ArF excimer laser exposure light; and a hard mask layer formed on the light-absorbing layer and having an etching barrier function for the light-absorbing layer.

7. The mask blank according to claim 6, wherein the light-absorbing layer comprises simple silicon (Si).

8. The mask blank according to claim 3, wherein the light-shielding layer has the optical density (OD value) at the wavelength of ArF excimer laser exposure light adjusted to be in total into a value of 3.0 or more when combined with the optical density (OD value) of the light semitransmissive layer.

9. A negative-type resist layer attached mask blank, comprising the mask blank recited in claim 1, and a negative-type resist layer formed on the mask blank.

10. A method for producing a pattern formed body, using a phase shift mask made from the mask blank recited in claim 1,
comprising a step of using the phase shift mask to form a resist pattern by negative tone development.

11. A halftone phase shift mask to which ArF excimer laser exposure light is to be applied,
the mask comprising a transparent substrate, and a light semitransmissive layer pattern formed on the transparent substrate and made only of Si and N or a light semitransmissive layer pattern formed on the transparent substrate and made only of Si, N and O,
wherein the light semitransmissive layer pattern has an extinction coefficient of 0.2 to 0.45 at a wavelength of ArF excimer laser exposure light, a refractive index of 2.3 to 2.7 at the wavelength of ArF excimer laser exposure light, and a transmittance of 15% to 38% at the wavelength of ArF excimer laser exposure light, and further has a layer thickness of 57 nm to 67 nm.

12. The phase shift mask according to claim 11, wherein the light semitransmissive layer pattern comprises a convex pattern-element having a width or length of 60 nm or less.

13. The phase shift mask according to claim 11, wherein: the light semitransmissive layer pattern has a main pattern which is to be resolved onto a wafer, and an assistant pattern which is used to assist the resolution of the main pattern and is not to be resolved onto the wafer; and the assistant pattern comprises one or more convex pattern-elements each having a width or length of 60 nm or less.

14. The phase shift mask according to claim 11, wherein the light semitransmissive layer pattern is formed directly on the transparent substrate.

15. The phase shift mask according to claim 11, which is a negative-type phase shift mask.

16. The phase shift mask according to claim 11, further comprising a light-shielding layer pattern formed on the light semitransmissive layer pattern, an optical density (OD value) of this light-shielding layer pattern at the wavelength of ArF excimer laser exposure light being adjusted to be in total into a desired value (OD value) when combined with an optical density of the light semitransmissive layer pattern.

17. The phase shift mask according to claim 16, wherein the light-shielding layer pattern has a monolayered structure comprising a light-absorbing layer pattern formed on the light semitransmissive layer pattern and having an etching barrier function for the light semitransmissive layer pattern and a light-absorbing function of absorbing the ArF excimer laser exposure light.

18. The phase shift mask according to claim 16, wherein the light-shielding layer pattern has a bilayered structure comprising: an etching barrier layer pattern formed on the light semitransmissive layer pattern and having an etching barrier function for the light semitransmissive layer pattern; and a light-absorbing layer pattern formed on the etching barrier layer pattern and having a light-absorbing function of absorbing the ArF excimer laser exposure light.

19. The phase shift mask according to claim 18, wherein the light-absorbing layer pattern comprises simple silicon (Si).

20. The phase shift mask according to according to claim 16, wherein the light-shielding layer pattern has the optical density (OD value) at the wavelength of ArF excimer laser exposure light adjusted to be in total into a value of 3.0 or more when combined with the optical density of the light semitransmissive layer pattern.

\* \* \* \* \*